(12) United States Patent
Ikeda

(10) Patent No.: US 9,001,565 B2
(45) Date of Patent: Apr. 7, 2015

(54) SEMICONDUCTOR DEVICE WITH MEMORY DEVICE

(71) Applicant: Elpida Memory, Inc., Tokyo (JP)

(72) Inventor: Noriaki Ikeda, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 11 days.

(21) Appl. No.: 13/868,532

(22) Filed: Apr. 23, 2013

(65) Prior Publication Data

US 2013/0286715 A1  Oct. 31, 2013

(30) Foreign Application Priority Data

Apr. 25, 2012  (JP) .................................. 2012-099810
Mar. 6, 2013  (JP) .................................. 2013-043831

(51) Int. Cl.
| | | |
|---|---|---|
| G11C 11/24 | (2006.01) | |
| G11C 11/401 | (2006.01) | |
| G11C 5/02 | (2006.01) | |
| G11C 11/4097 | (2006.01) | |
| H01L 27/02 | (2006.01) | |
| H01L 27/108 | (2006.01) | |
| H01L 49/02 | (2006.01) | |

(52) U.S. Cl.
CPC .............. *G11C 11/401* (2013.01); *G11C 5/025* (2013.01); *G11C 11/4097* (2013.01); *H01L 27/0203* (2013.01); *H01L 27/10852* (2013.01); *H01L 27/10855* (2013.01); *H01L 27/10894* (2013.01); *H01L 27/10897* (2013.01); *H01L 28/91* (2013.01)

(58) Field of Classification Search
USPC .............. 365/51, 63, 102, 129, 149, 164, 244
See application file for complete search history.

(56) References Cited

U.S. PATENT DOCUMENTS

| | | | |
|---|---|---|---|
| 6,177,293 B1 * | 1/2001 | Netzer et al. .................... 438/73 |
| 8,492,805 B2 | 7/2013 | Akiyama et al. | |
| 2007/0048976 A1 * | 3/2007 | Raghu ............................ 438/478 |
| 2011/0018052 A1 * | 1/2011 | Fujiwara et al. ............. 257/324 |
| 2011/0169061 A1 | 7/2011 | Sukekawa et al. | |
| 2011/0291168 A1 * | 12/2011 | Iwasa ............................ 257/296 |
| 2013/0288419 A1 | 10/2013 | Akiyama et al. | |

FOREIGN PATENT DOCUMENTS

| | | |
|---|---|---|
| JP | 2010-165742 | 7/2010 |
| JP | 2011-146428 | 7/2011 |
| JP | 2011-159706 | 8/2011 |

* cited by examiner

*Primary Examiner* — Fernando Hidalgo
(74) *Attorney, Agent, or Firm* — Young & Thompson

(57) ABSTRACT

A memory mat (101) includes a main body portion (200) that includes a first capacitor (203A), a linear conductive film (204) that is formed between the main body portion (200) and a peripheral circuit (104), and a second capacitor (203B) that is formed to be in contact with the conductive film (204) at a bottom of the second capacitor (203B). The first capacitor (203A) is in contact with a contact layer (202) at a bottom of the first capacitor (203A).

8 Claims, 27 Drawing Sheets

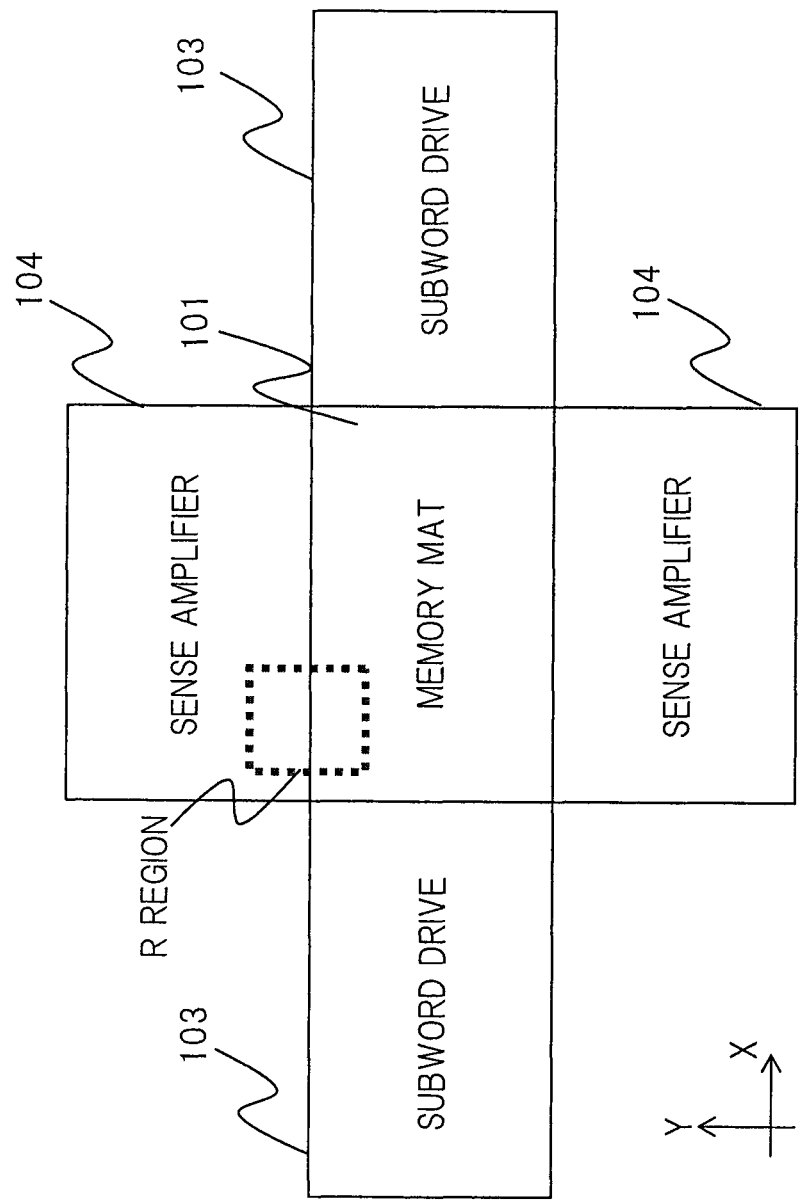

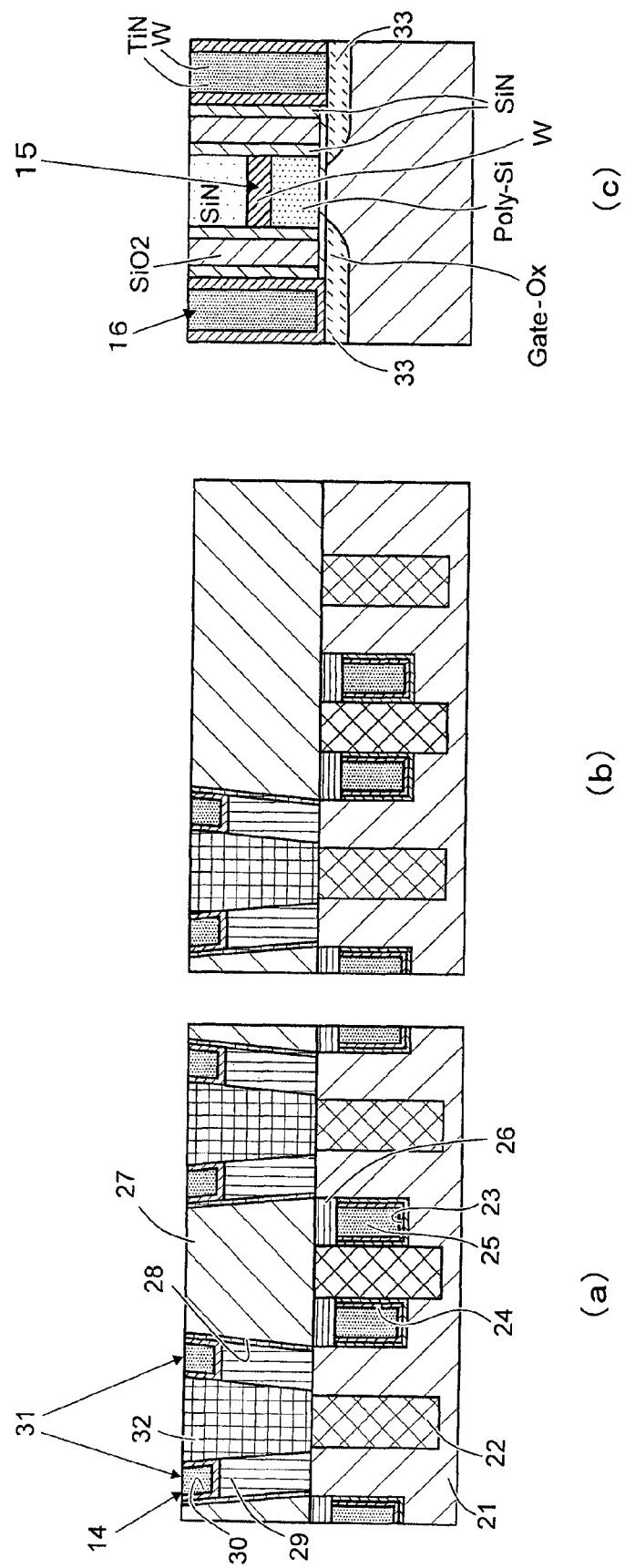

Fig.15
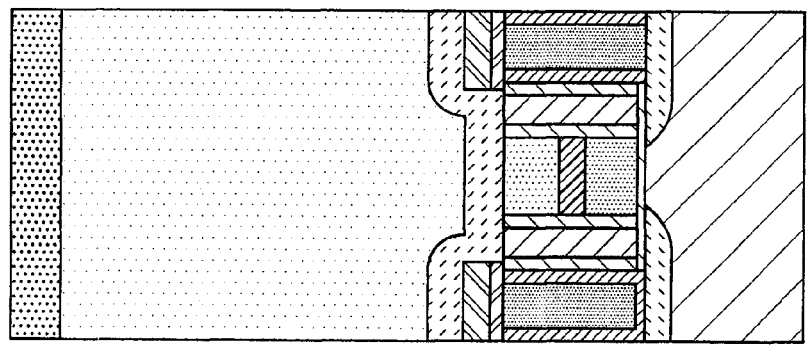
(c)
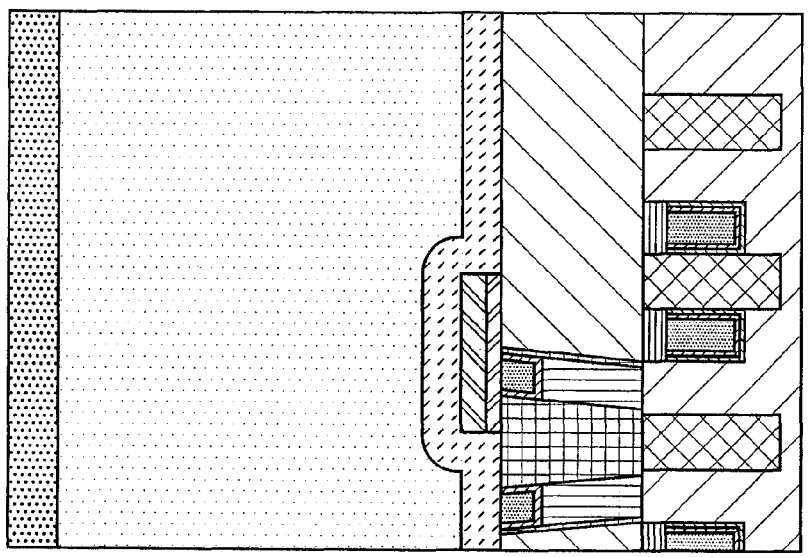
(b)
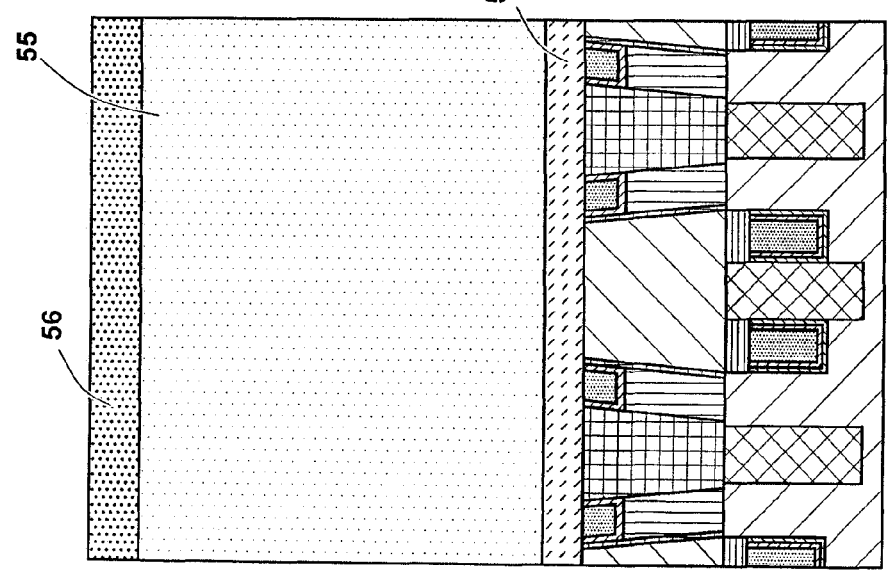
(a)

Fig.16
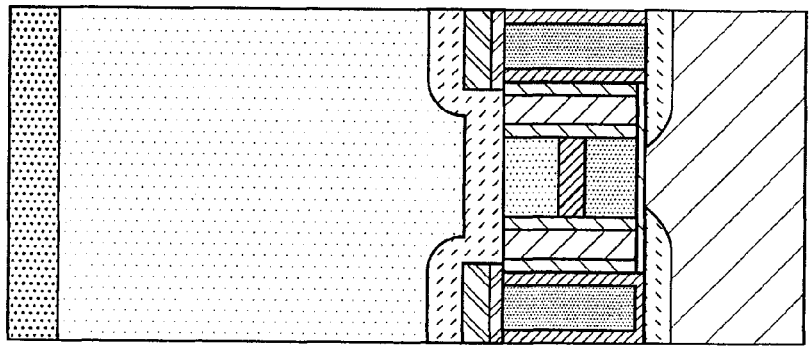
(c)
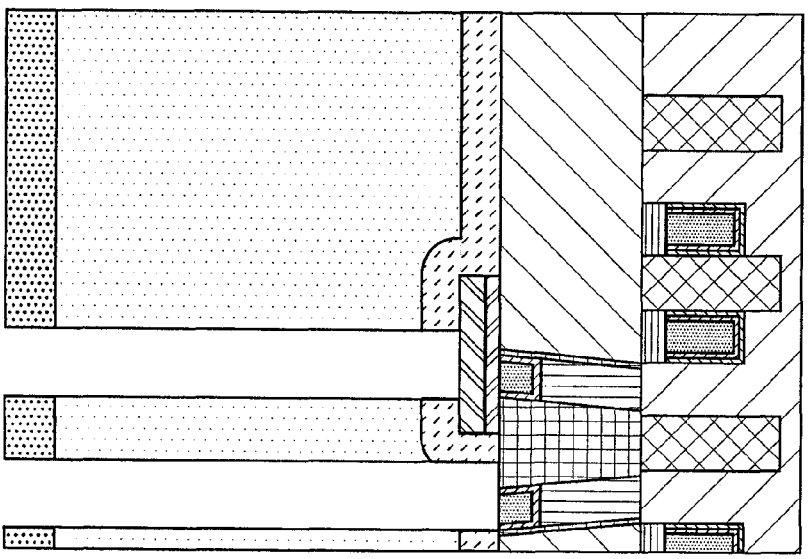
(b)
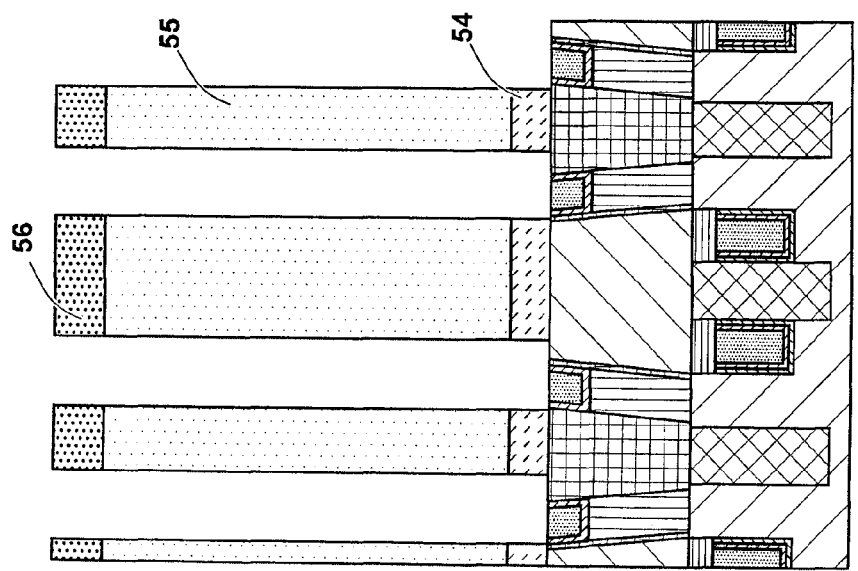
(a)

SEMICONDUCTOR DEVICE WITH MEMORY DEVICE

BACKGROUND OF THE INVENTION

1. Field of the Invention

The present invention relates to a semiconductor device.

2. Description of Related Art

In a memory device such as a DRAM (Dynamic Random Access Memory) device, peripheral circuits such as a sub-word driver and a sense amplifier are formed around a memory mat which is a circuit for storing data.

In a memory mat, capacitors formed on a contact layer called a capacitor contact are arranged in a matrix. Formation of such a capacitor generally requires a trimming process of removing an interlayer dielectric film around the capacitor by wet etching. In the trimming process, however, a solution used in wet etching may penetrate into a peripheral circuit to reduce in product yield and product quality.

The semiconductor device disclosed in JP2010-165742A prevents a solution used in wet etching from penetrating from a side portion or an upper surface of a memory mat into a peripheral circuit by forming a support film made of, for example, silicon nitride above an interlayer oxide film around a capacitor contact such that the support film surrounds the memory mat. The semiconductor device disclosed in JP2010-165742A, however, may be unable to prevent a solution used in wet etching from penetrating into a peripheral circuit.

The problem will be described below with reference to FIGS. 1 and 2. Note that FIG. 1 is a top view of a memory mat and FIG. 2 is a cross-sectional view of the memory mat taken at an outer peripheral portion (along line B-B' in FIG. 1). FIGS. 1 and 2 have written notes on a problematic phenomenon, and the like.

As shown in FIGS. 1 and 2, each capacitor 1 of memory mat 10 is formed on capacitor contact 2. However, the position of each capacitor 1 and that of corresponding capacitor contact 2 may not coincide exactly with each other due to, for example, constraints on the memory device layout, and pattern misalignment by photolithography, which leads to deviation of capacitor 1 from capacitor contact 2, as shown in FIG. 2.

Deviation of capacitor 1 has been conventionally prevented by inserting a pad between capacitor 1 and capacitor contact 2. In recent years, miniaturization of semiconductor devices has increased use of double patterning in pad formation, which has led to an increase in the cost required to form a pad. For this reason, pad-less technology that uses no pad has been progressing, resulting in an increase in deviation of capacitor 1.

Along with miniaturization of capacitors, lower electrode 1A of capacitor 1 is becoming thinner. A solution used in wet etching may thus penetrate through lower electrode 1A into a portion below lower electrode 1A. If capacitor 1 deviates from capacitor contact 2, the solution penetrates into interlayer oxide film 3 around a capacitor contact which is located below capacitor 1 in large amounts.

In particular, if capacitor 1 at an outermost peripheral portion of memory mat 10 deviates from capacitor contact 2, a solution will penetrate into a peripheral circuit through interlayer oxide film 3 around capacitor contact 2 to cause large-scale dissolution of interlayer oxide film 3 in the peripheral circuit.

Even if a solution penetrates into interlayer oxide film 3, recovery is possible as long as the penetration falls within the memory mat 10. If a solution penetrates into a peripheral circuit, recovery will be very difficult. It is thus important to prevent a solution from penetrating into a peripheral circuit.

In contrast, the semiconductor device disclosed in JP2010-165742A is based on the assumption that a pad is inserted between a capacitor and a capacitor contact and does not take into consideration deviation of the capacitor. Since a support film is only formed above an interlayer oxide film around the capacitor contacts, the semiconductor device cannot prevent a solution from penetrating into a peripheral circuit through the interlayer oxide film around capacitor contacts.

SUMMARY OF THE INVENTION

In one embodiment, there is provided a semiconductor device that includes a memory mat and a peripheral circuit that is formed around the memory mat. The memory mat includes a main body portion that includes a first capacitor, a linear conductive film that is formed between the main body portion and the peripheral circuit, and a second capacitor that is formed to be in contact with the conductive film at the bottom of the second capacitor. The first capacitor is formed to be in contact with the contact layer at the bottom of the first capacitor.

According to the embodiments, the second capacitor that is located between the main body portion and the peripheral circuit is in contact with the conductive film at the bottom. This enables preventing a solution used in wet etching from penetrating through a lower electrode of the second capacitor into an interlayer oxide film around a corresponding capacitor contact and enables preventing the solution into the peripheral circuit.

BRIEF DESCRIPTION OF THE DRAWINGS

The above features and advantages of the present invention will become more apparent from the following description of certain preferred embodiments taken in conjunction with the accompanying drawings, in which:

FIG. 10A is a view showing a different combination of a memory mat and peripheral circuits formed around the memory mat;

FIG. 11 is a view for explaining a first step of a formation method of forming the memory mat;

FIG. 15 is a view for explaining a fifth step of the formation method of forming the memory mat;

FIG. 16 is a view for explaining a sixth step of the formation method of forming the memory mat;

DETAILED DESCRIPTION OF THE PREFERRED EMBODIMENTS

Figure 1:
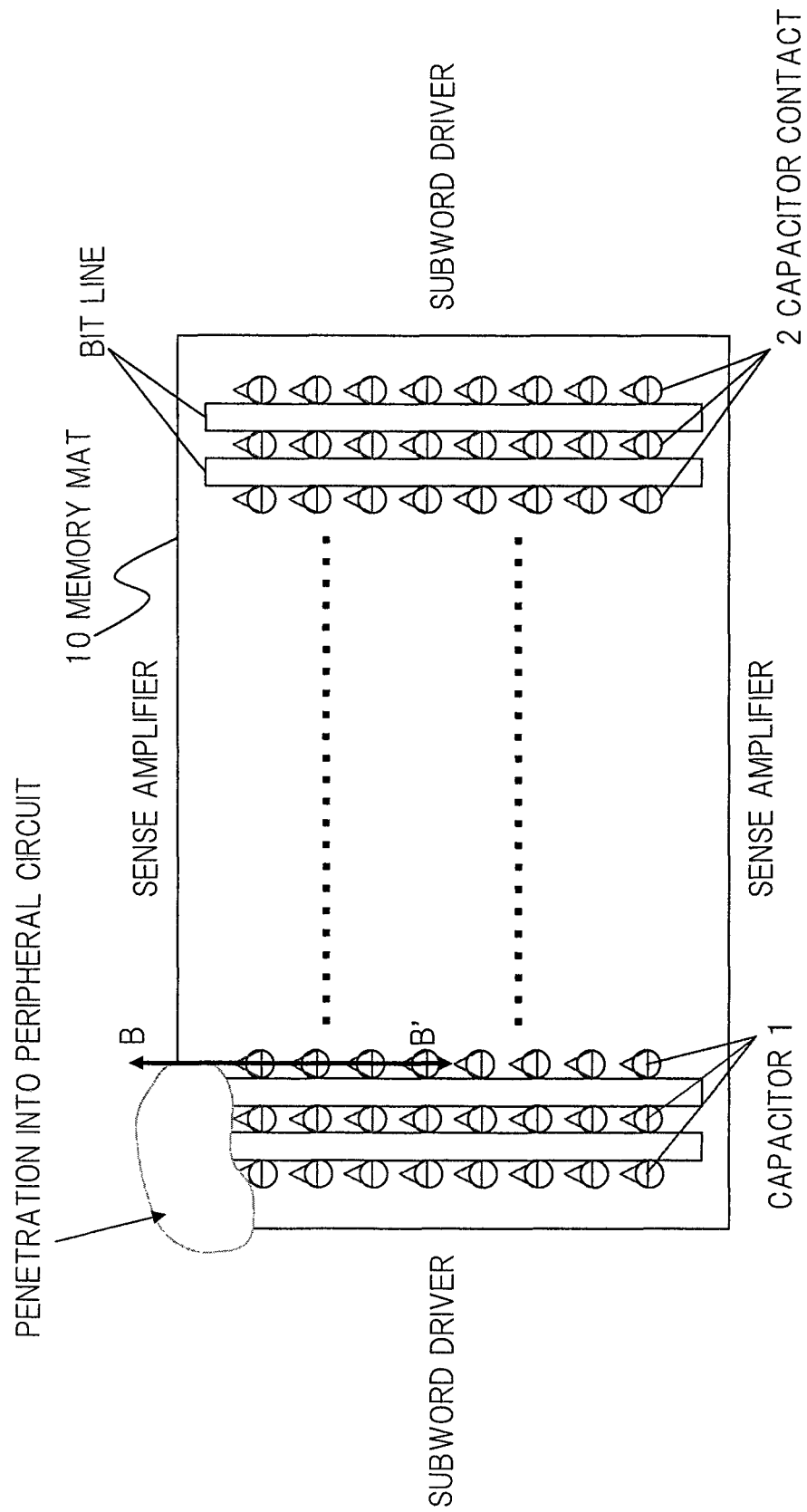
FIG. 1 is a view for explaining a problem of the related art.
Figure 2:
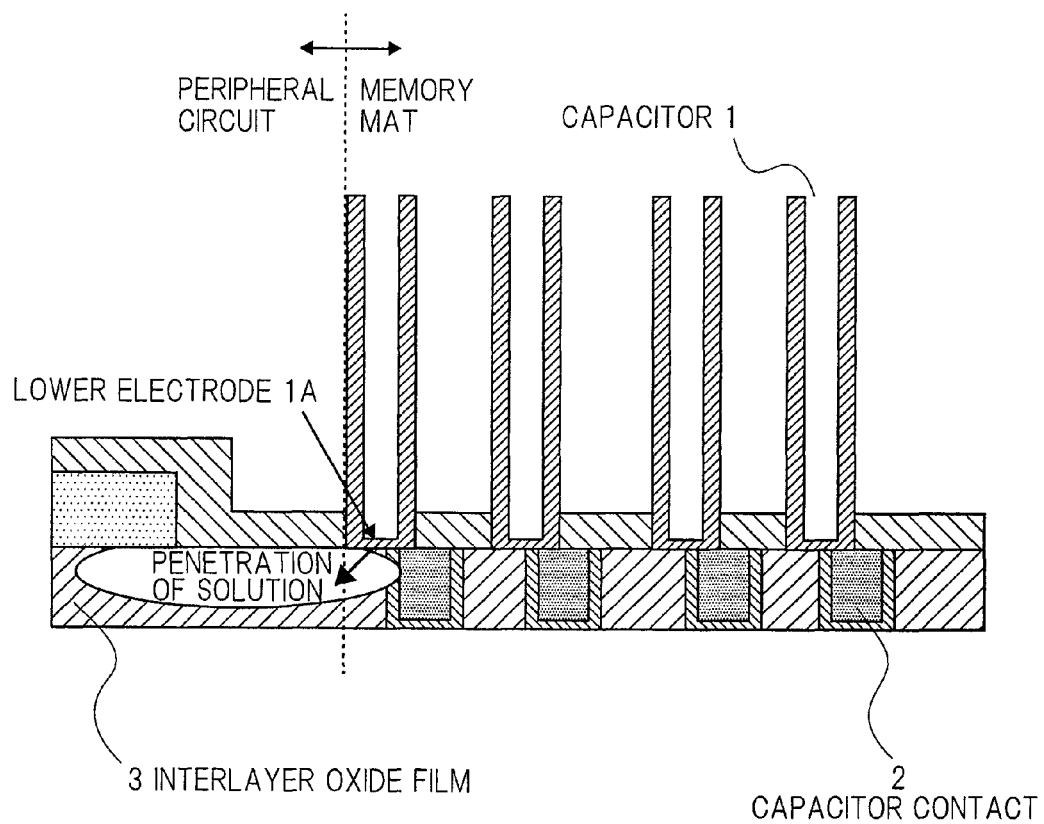
FIG. 2 is a view for explaining a problem with a related-art semiconductor device.

The invention will be now described herein with reference to illustrative embodiments. Those skilled in the art will recognize that many alternative embodiments can be realized using the teachings of the present invention and that the invention is not limited to the embodiments illustrated for explanatory purposes.

In the description below, components having the same functions may be denoted by the same reference numerals, and a description thereof may be omitted.

Figure 3:
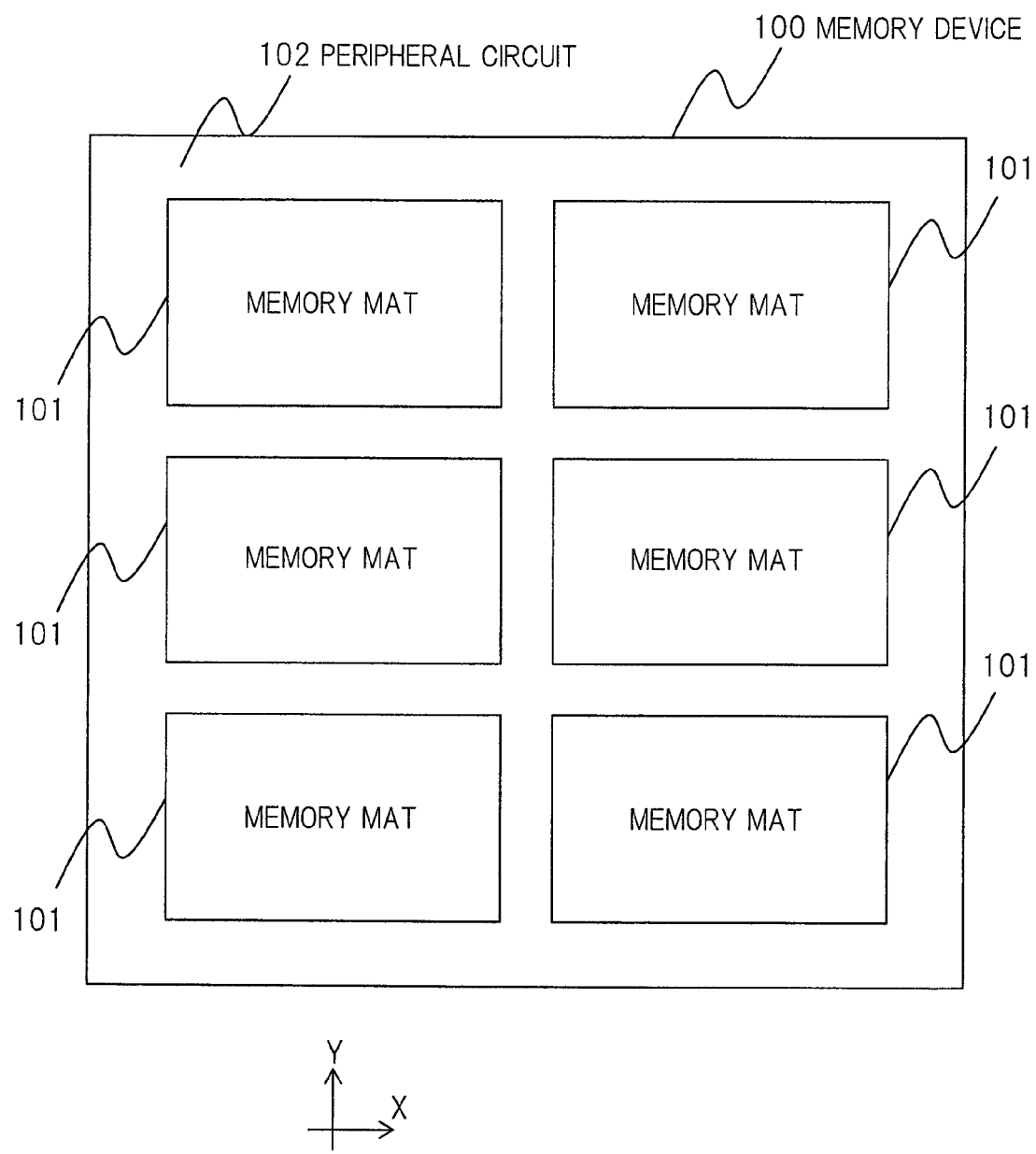
FIG. 3 is a top view schematically showing a memory device included in a semiconductor device according to a first exemplary embodiment.

FIG. 3 is a top view schematically showing a memory device included in a semiconductor device according to a first exemplary embodiment.

Memory device 100 shown in FIG. 3 includes a plurality of memory mats 101 which are arranged in a matrix and peripheral circuits 102 which are formed around memory mats 101. In the present exemplary embodiment, each memory mat 101 is formed in the shape of a rectangle, and one of the directions in plane with memory mat 101, which is parallel to one side of memory mat 101, is referred to as an X direction while the other direction that is orthogonal to the X direction is referred to a Y direction.

Figure 4:
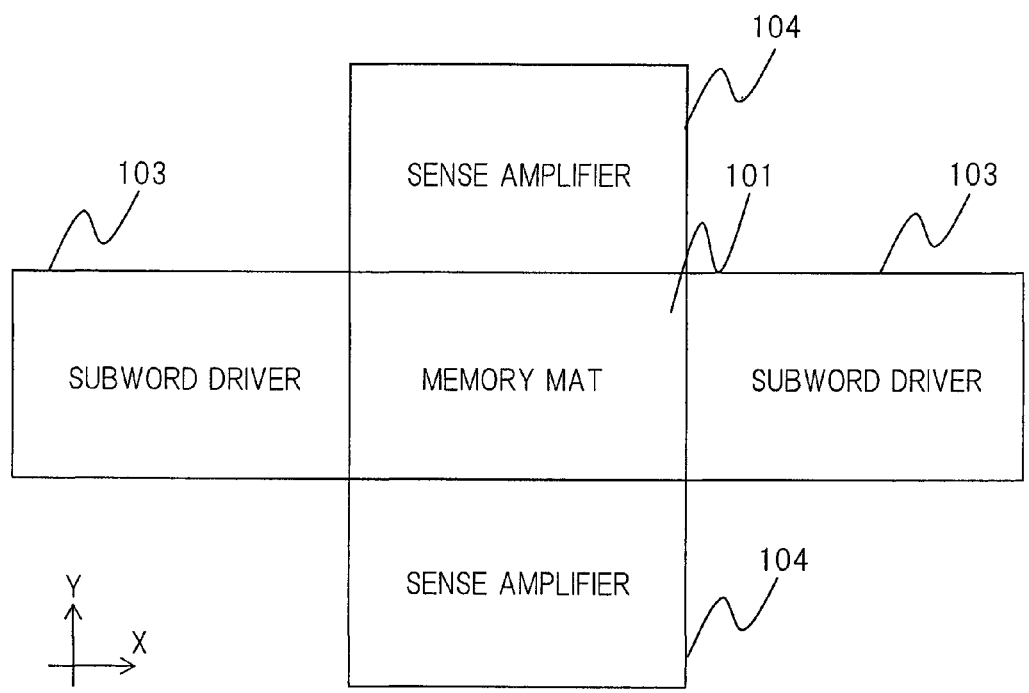
FIG. 4 is a view showing a combination of a memory mat and peripheral circuits formed around the memory mat.

FIG. 4 is a view showing a combination of memory mat 101 and peripheral circuits 102 that are formed around memory mat 101. As shown in FIG. 4, subword drivers (SWDs) 103 and sense amplifiers (SAMPs) 104 which are peripheral circuits 102 are formed around memory mat 101. More specifically, subword drivers 103 are formed on two sides in the X direction of memory mat 101, and sense amplifiers 104 are formed on two sides in the Y direction of memory mat 101.

Figure 5:
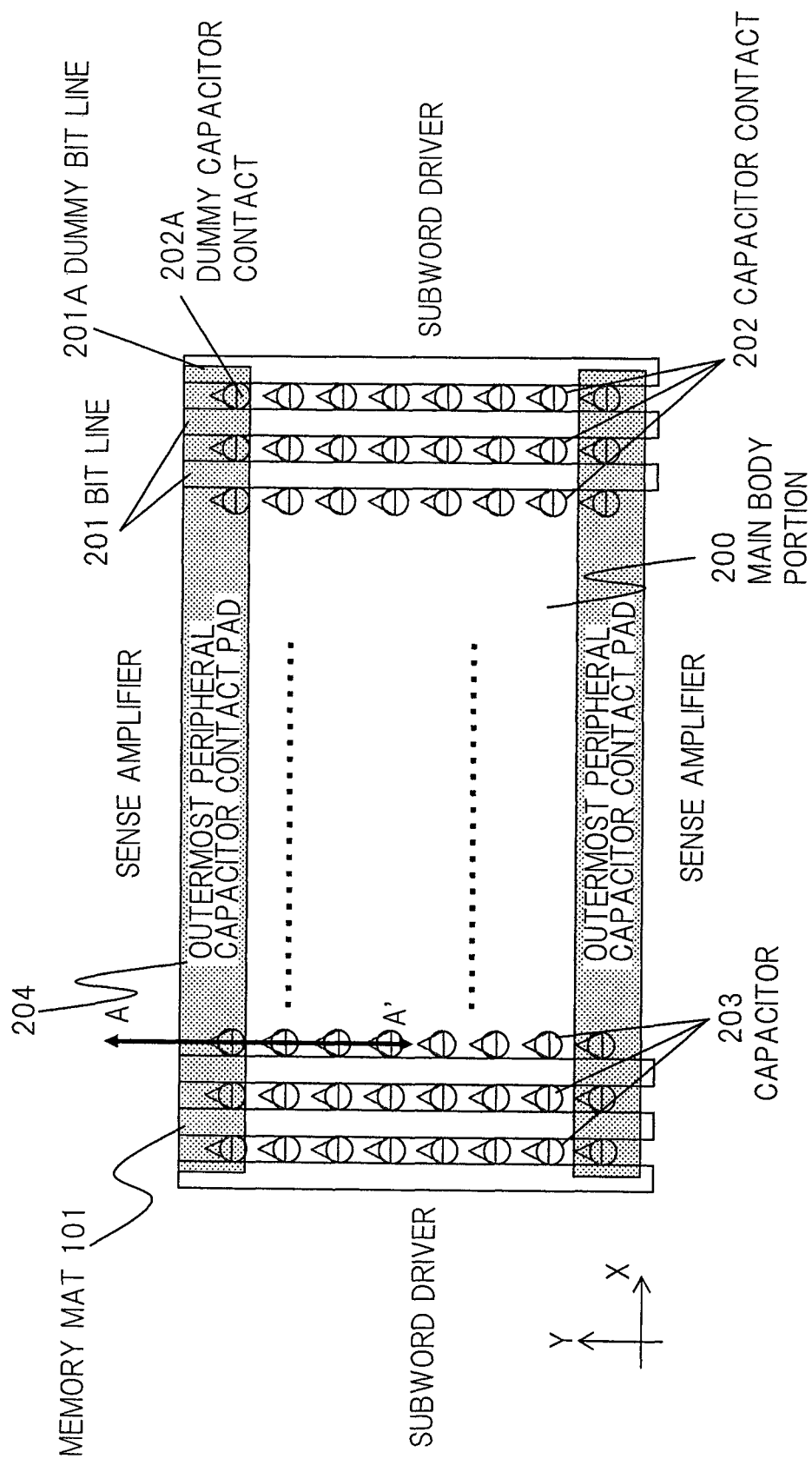
FIG. 5 is a top view schematically showing a memory mat configuration.

FIG. 5 is a top view schematically showing a configuration of memory mat 101.

As shown in FIG. 5, memory mat 101 includes a plurality of bit lines 201 which extend along the Y direction that is a first direction in a plane with memory mat 101, a plurality of capacitor contacts 202 which are arranged along each bit line 201, and a plurality of capacitors 203 which are formed on respective capacitor contacts 202.

Bit lines 201 are arranged at predetermined intervals in the X direction that is a second direction. Of bit lines 201, bit lines 201A which are located at an outermost periphery are dummy bit lines.

Each capacitor contact 202 is a contact layer which electrically connects a diffusion layer constituting a MOSFET which is a switching element of memory mat 101 and capacitor 203. Of capacitor contacts 202, capacitor contacts 202A which are located in outermost peripheral portions in the Y direction are dummy capacitor contacts. Bit line 201A and capacitor contact 202A may hereinafter also be referred to as dummy bit line 201A and dummy capacitor contact 202A, respectively.

A portion surrounded by dummy bit lines 201A and dummy capacitor contacts 202A constitutes main body portion 200 which actually stores data. Accordingly, dummy bit line 201A extending along the Y direction is formed between main body portion 200 and peripheral circuit 102 on each side in the X direction, and dummy capacitor contacts 202A that are arranged in one row in the X direction are formed between main body portion 200 and peripheral circuit 102 on each side in the Y direction.

Outermost peripheral capacitor contact pad 204 which is a linear conductive film is formed between main body portion 200 and peripheral circuit 102 so as to cover dummy capacitor contacts 202A.

More specifically, outermost peripheral capacitor contact pads 204 are provided on two sides, respectively, in the Y direction of the main body portion 200 and extend along the X direction. Note that a first capacitor which is capacitor 203 in main body portion 200 is formed to be in contact with capacitor contact 202 at its bottom, and a second capacitor which is capacitor 203 on dummy capacitor contact 202A is formed to be in contact with outermost peripheral capacitor contact pad 204 at its bottom.

Figure 6:
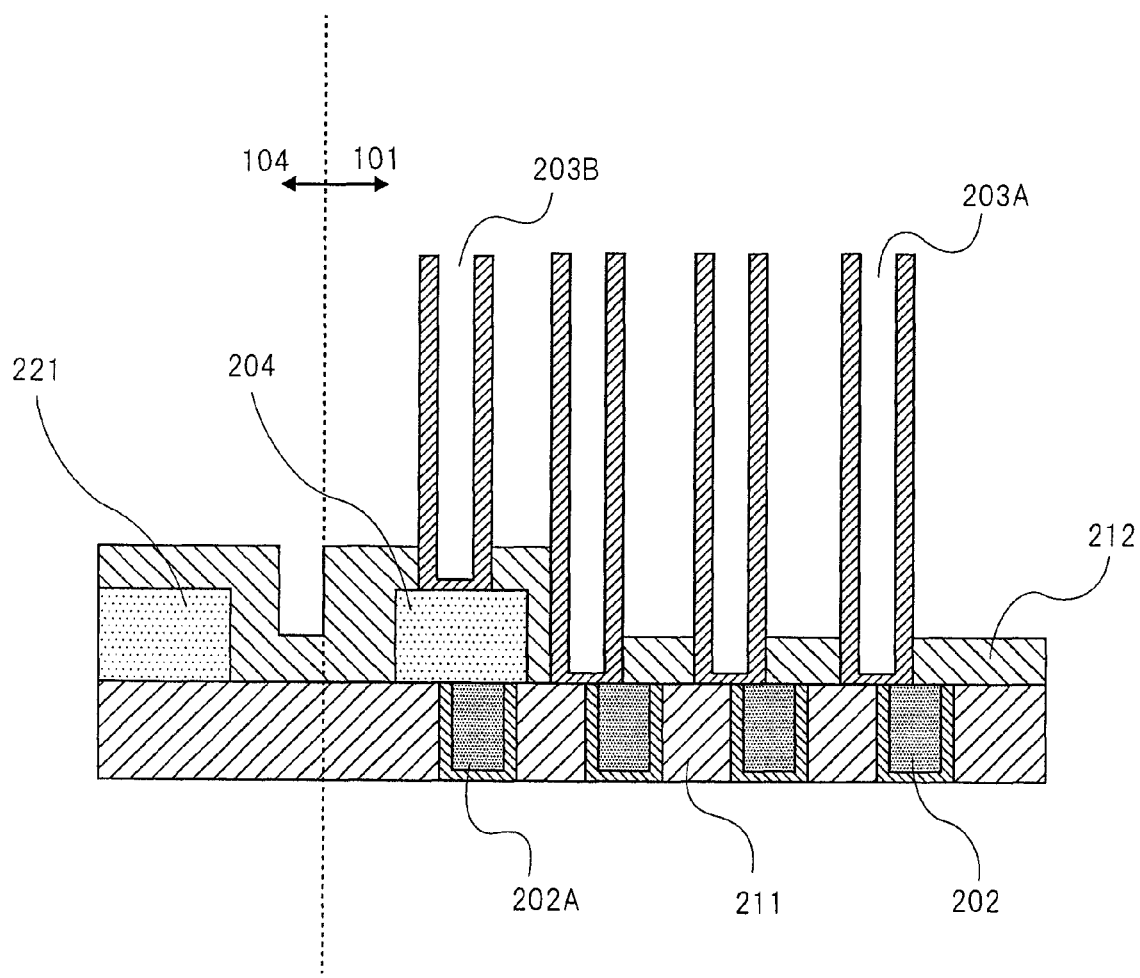
FIG. 6 is a vertical cross-sectional view schematically showing the memory mat configuration.

FIG. 6 is a vertical cross-sectional view of memory mat 101 taken at the outer peripheral portion (along line A-A' in FIG. 5).

As shown in FIG. 6, each capacitor contact 202 is buried in interlayer oxide film 211. Note that the material for interlayer oxide film 211 is, for example, $SiO_2$ (silicon dioxide).

Outermost peripheral capacitor contact pad 204 is formed on dummy capacitor contacts 202A among capacitor contacts 202 such that the bottom of outermost peripheral capacitor contact pad 204 is in contact with dummy capacitor contacts 202A.

Interlayer dielectric film 212 is formed so as to cover capacitor contacts 202, interlayer oxide film 211, and outermost peripheral capacitor contact pad 204, and each capacitor 203 is formed to extend through interlayer dielectric film 212 and to be in direct contact with capacitor contact 202 or to be in contact with capacitor contact 202 via outermost peripheral capacitor contact pad 204.

More specifically, first capacitor 203A is formed on each of capacitor contacts 202 except for dummy capacitor contacts 202A that is in direct contact with capacitor contact 202 at its bottom, and second capacitor 203B is formed above each dummy capacitor contact 202A to be in contact with outermost peripheral capacitor contact pad 204 at its bottom. Note that the material for interlayer dielectric film 212 is, for example, SiN (silicon nitride).

Note that outermost peripheral capacitor contact pad 204 is formed through patterning by being exposed together with a piece of predetermined wiring in peripheral circuit 102 (e.g., a piece 221 of M0 wiring in sense amplifier 104) using a single mask.

As has been described above, according to the present exemplary embodiment, each second capacitor 203B that is located between main body portion 200 and peripheral circuit 102 is in contact with outermost peripheral capacitor contact pad 204 at its bottom. This configuration enables a solution that is used in wet etching to be prevented from penetrating through a lower electrode of second capacitor 203B into interlayer oxide film 211 around the corresponding capacitor contact and enables preventing the solution from penetrating into peripheral circuit 102. Additionally, outermost peripheral capacitor contact pad 204 is linear and can be formed together with a piece of predetermined wiring in peripheral circuit 102 by patterning using a single mask. This allows a reduction in cost increases which occur when there is an increase in the number of masks. It is thus possible to improve the yield and quality of products at low cost.

Moreover, in the present exemplary embodiment, dummy bit line 201A is formed between main body portion 200 and peripheral circuit 102 on each side in the X direction. Since dummy bit line 201A enables preventing a solution from penetrating in the X direction, the solution can be prevented from penetrating in the X direction, i.e., into subword drivers 103.

As described above, a semiconductor device according to the present exemplary embodiment includes a memory mat (101) and a peripheral circuit (104) that is formed around the memory mat (101). The memory mat (101) includes a main body portion (200) that includes a first capacitor (203A), a linear conductive film (204) that is formed between the main body portion (200) and the peripheral circuit (104), and a second capacitor (2036) that is formed to be in contact with the conductive film (204) at a bottom of the second capacitor (203B). The first capacitor (203A) is formed to be in contact with the contact layer (202) at the bottom of the first capacitor (203A).

Also, the semiconductor device according to the present exemplary embodiment includes a bit line (201) that extends along a first direction in a plane with the memory mat (101), and the conductive film (204) is formed along a second direction orthogonal to the first direction between the main body portion (200) and the peripheral circuit (104) in the first direction.

Additionally, the semiconductor device according to the present exemplary embodiment includes a dummy bit line (201A) that extends along a first direction between the main body portion (200) and the peripheral circuit (104) in the second direction.

Another exemplary embodiment will be described.

Figure 7:
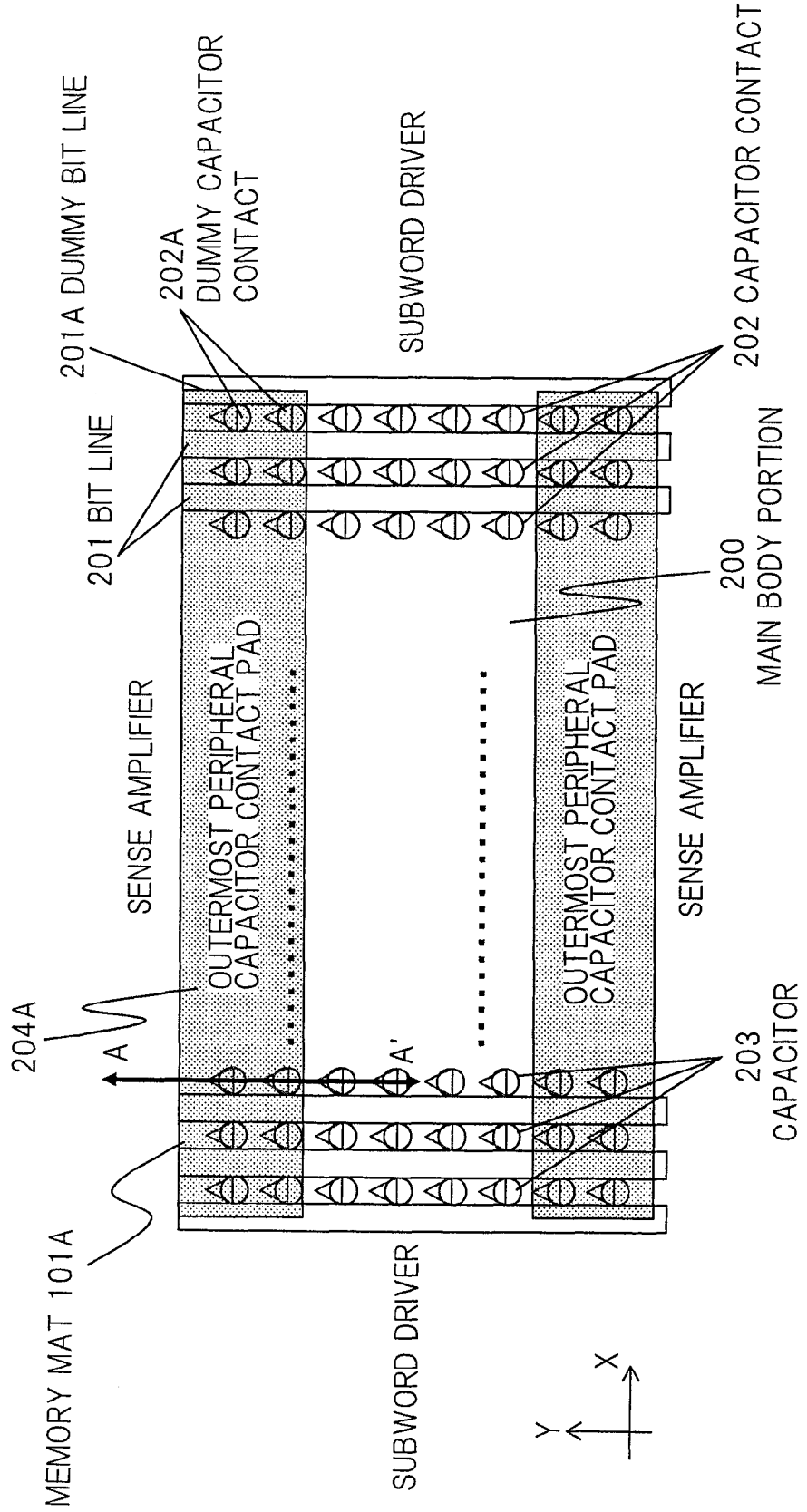
FIG. 7 is a top view schematically showing a different memory mat configuration.

FIG. 7 is a top view schematically showing the configuration of a memory mat included in a semiconductor device according to a second exemplary embodiment.

Memory mat 101A shown in FIG. 7 is different from memory mat 101 shown in FIG. 5 in that memory mat 101A includes outermost peripheral capacitor contact pad 204A instead of outermost peripheral capacitor contact pad 204.

Outermost peripheral capacitor contact pad 204A has a width wider than that of outermost peripheral capacitor contact pad 204 and is formed so as not to cover capacitor contacts 202 in one row in the outermost peripheral portion in a Y direction but to cover capacitor contacts 202 in a plurality of rows (two rows in FIG. 7) in the outermost peripheral portion among capacitor contacts 202. In this case, the capacitor contacts 202 that are covered by outermost peripheral capacitor contact pads 204A are dummy capacitor contacts 202A, and all second capacitors 203B are each formed to be in contact with outermost peripheral capacitor contact pad 204A at its bottom.

Accordingly, a plurality of second capacitors 203B are formed to be arranged in the Y direction from peripheral circuit 102 (more specifically, sense amplifier 104) toward main body portion 200. This configuration enables more reliably preventing a solution from penetrating to be more reliably prevented from penetrating into the peripheral circuit 102 via interlayer oxide film 211.

As described above, a semiconductor device according to the present exemplary embodiment is configured such that a plurality of second capacitors (203B) are provided in a direction from a peripheral circuit (102) toward a main body portion (200).

Figure 8:
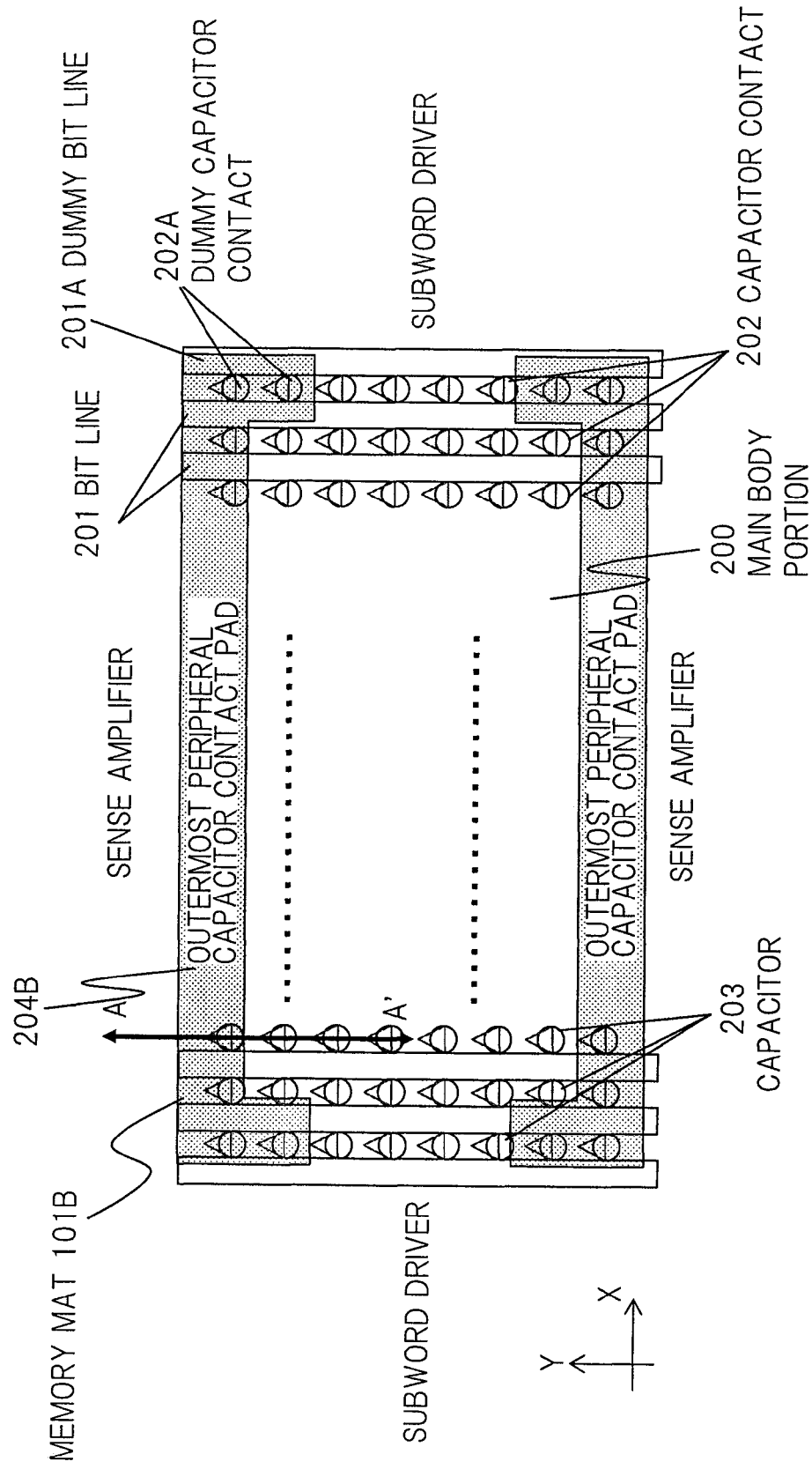
FIG. 8 is a top view schematically showing a different memory mat configuration.

FIG. 8 is a top view schematically showing the configuration of a memory mat included in a semiconductor device according to a third exemplary embodiment.

Memory mat 101B shown in FIG. 8 is different from memory mat 101 shown in FIG. 5 in that memory mat 101B includes outermost peripheral capacitor contact pad 204B instead of outermost peripheral capacitor contact pad 204.

Outermost peripheral capacitor contact pad 204B has a shape which is obtained by bending two ends of outermost peripheral capacitor contact pad 204 away from peripheral circuit 102 (more specifically, sense amplifier 104) in the Y direction. Note that outermost peripheral capacitor contact pad 204B may have a shape which is obtained by bending at least one end of outermost peripheral capacitor contact pad 204 in the Y direction.

If a solution used in wet etching penetrates into interlayer oxide film 211 in large amounts, the solution may penetrate from a corner of memory mat 101B into subword driver 103. Since the ends of outermost peripheral capacitor contact pad 204B are bent away from sense amplifier 104 in the Y direction in the present exemplary embodiment, even if a solution penetrates into interlayer oxide film 211 in large amounts, the solution can be prevented from penetrating into subword driver 103.

As described above, a semiconductor device according to the present exemplary embodiment is configured such that at least one end of the conductive film (204B) is bent away from peripheral circuit (102) in a first direction.

Figure 9:
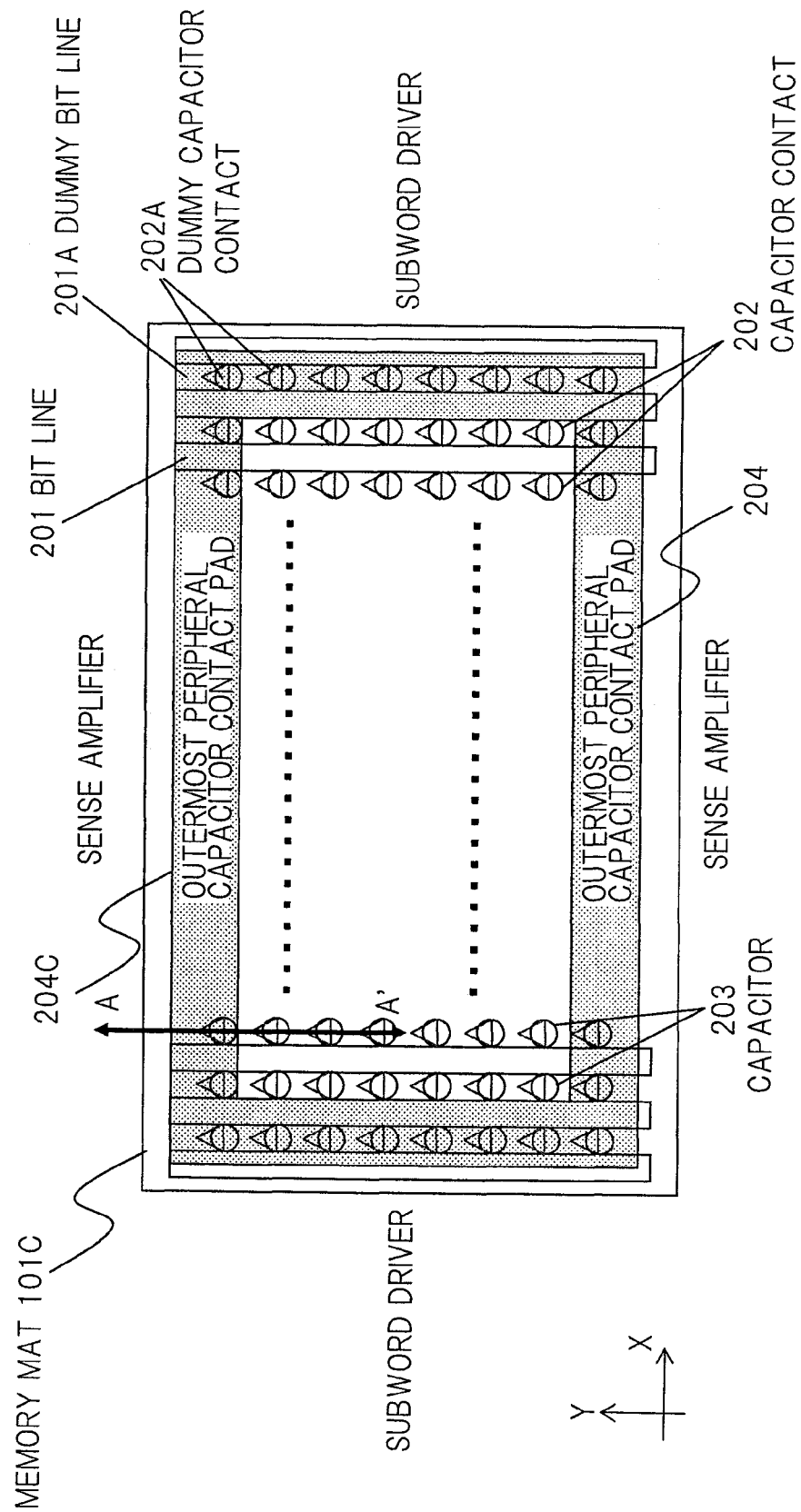
FIG. 9 is a top view schematically showing a different memory mat configuration.

FIG. 9 is a top view schematically showing the configuration of a memory mat included in a semiconductor device according to a fourth exemplary embodiment.

Memory mat 101C shown in FIG. 9 is different from memory mat 101 shown in FIG. 5 in that memory mat 101C includes outermost peripheral capacitor contact pad 204C instead of outermost peripheral capacitor contact pad 204.

Outermost peripheral capacitor contact pad 204C is formed so as to surround main body portion 200 not only in the Y direction but also in the X direction. This configuration enables more reliably preventing a solution from penetrating in the X direction, i.e., into subword driver 103.

As described above, a semiconductor device according to the present exemplary embodiment is configured such that conductive film (204C) surrounds main body portion (200).

Figure 10B:
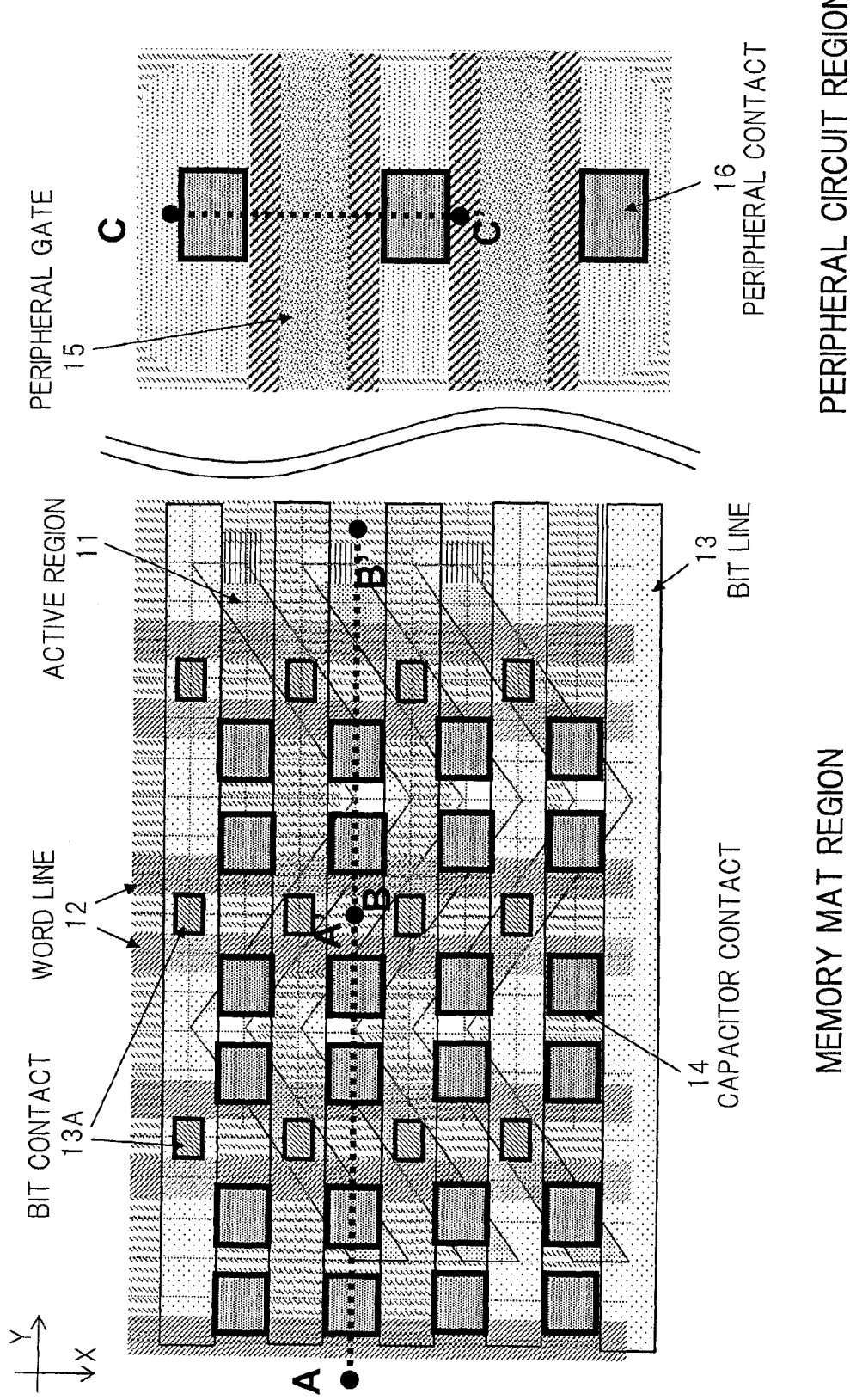
FIG. 10B is an enlarged view of region R in FIG. 10A.

FIGS. 10A and 10B are views showing the configuration of a memory device included in a semiconductor device according to a fifth exemplary embodiment. More specifically, FIG. 10A is a view showing an example of a combination of memory mat 101 and peripheral circuits 102 according to the present exemplary embodiment, and FIG. 10B is an enlarged view of region R shown in FIG. 10A. Note that region R shown in FIG. 10A has been rotated 90° clockwise in FIG. 10B. Note that the configuration shown in FIG. 10A is the same as that shown in FIG. 4.

As shown on the left side when FIG. 10B is placed in landscape orientation, in memory mat 101, active region 11 where a memory element is to be formed is formed diagonally to X and Y directions, word lines 12 are formed to extend along the X direction, and bit lines 13 are formed to extend along the Y direction. Capacitor contacts 14 are formed in each active region 11, and a capacitor is formed on each capacitor contact 14. Note that region R also includes a dummy capacitor contact which is a capacitor contact located in an outermost peripheral portion of memory mat 101 (i.e., at a boundary between memory mat 101 and peripheral circuit 102). Bit contact 13A which serves as a bit contact layer (Poly-Si) is formed underneath bit line 13.

A part of a peripheral circuit region which is a region where peripheral circuit 102 (more specifically, sense amplifier 104) is formed is shown on the right side of FIG. 10B. A gate (hereinafter referred to as peripheral gate 15) and a contact layer (hereinafter referred to as peripheral contact 16) are formed in the peripheral circuit region.

From among FIGS. 11 to 23, FIG. (a) are each a view showing a cross-section taken along line A-A' in FIG. 10B, FIG. (b) are each a view showing a cross-section taken along line B-B' in FIG. 10B, and FIG. (c) are each a view showing a cross-section taken along line C-C' in FIG. 10B.

As shown in FIG. 11, capacitor contacts 14 are formed in a region where memory mat 101 is to be formed, and peripheral contacts 16 are formed in the peripheral circuit region.

A formation method for the configuration shown in FIG. 11 will be briefly described. Active regions are first periodically formed at silicon substrate (Si-sub) 21, and silicon oxide films ($SiO_2$) 22 are buried between the active regions as STI (Shallow Trench Isolation). Ions are implanted into silicon substrate 21.

A trench for a buried word line is formed to extend across one of the active regions. Gate insulating film (Gate-Ox) 23 is formed in the trench, and barrier material (TiN) 24 and gate electrode material (W) 25 are buried in the trench. Thus, a buried word line is formed in the gate insulating film (Gate-Ox) 23, barrier material (TiN) 24 and gate electrode material (W) 25. Ions are again implanted into silicon substrate 21. After that, each trench is completely covered with silicon nitride film (SiN) 26.

Each bit contact 13A (not shown in FIG. 11) is formed between two of the word lines in the corresponding active region. Next, bit lines 13 (not shown in FIG. 11) are formed in the region where memory mat 101 is to be formed, and peripheral gates 15 are formed in the peripheral circuit region. After ions are implanted into peripheral gates 15, silicon substrate 21 is completely covered with silicon oxide film ($SiO_2$) 27, and capacitor contacts 14 that are each composed of polysilicon layer (Poly-Si) 29, barrier layer (TiN) 30, and tungsten layer (W) 31 are formed between bit lines 13 in the region where memory mat 101 is to be formed, as the inside wall of the silicon oxide film 27 through silicon nitride film 28, and peripheral contacts 16 are formed in the peripheral circuit region. Note that the space between two adjacent ones of capacitor contacts 14 is filled with silicon nitride film 32. Each peripheral contact 16 is formed adjacent to peripheral gate 15, which is composed of a stack of a tungsten layer (W) and a polysilicon layer (Poly-Si), with a sidewall insulating film between peripheral contact 16 and peripheral gate 15 and is connected to diffusion layer 33 (more specifically, a source diffusion layer or a drain diffusion layer).

The detailed configuration of each component of the peripheral circuit region does not directly relate to the invention, and a description thereof will be omitted. The materials for the components of the peripheral circuit region and the like are shown in FIG. 11.

Figure 12:
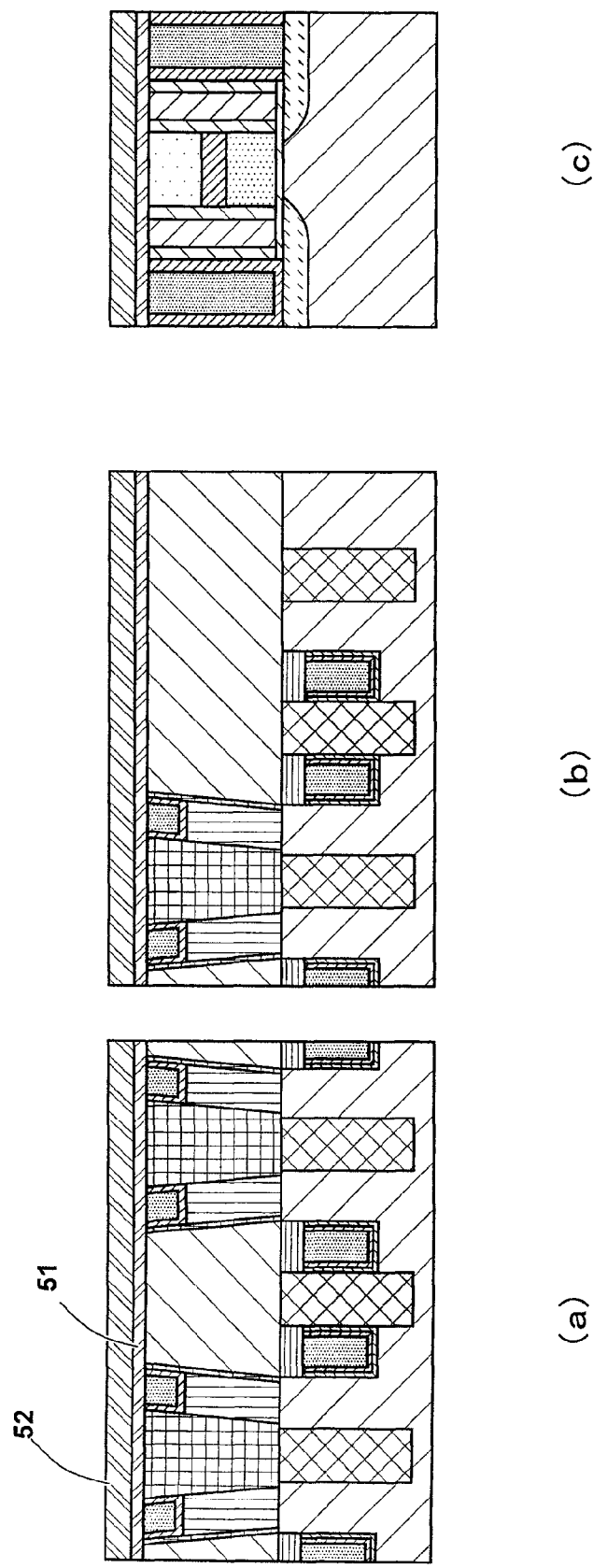
FIG. 12 is a view for explaining a second step of the formation method of forming the memory mat.
Figure 13:
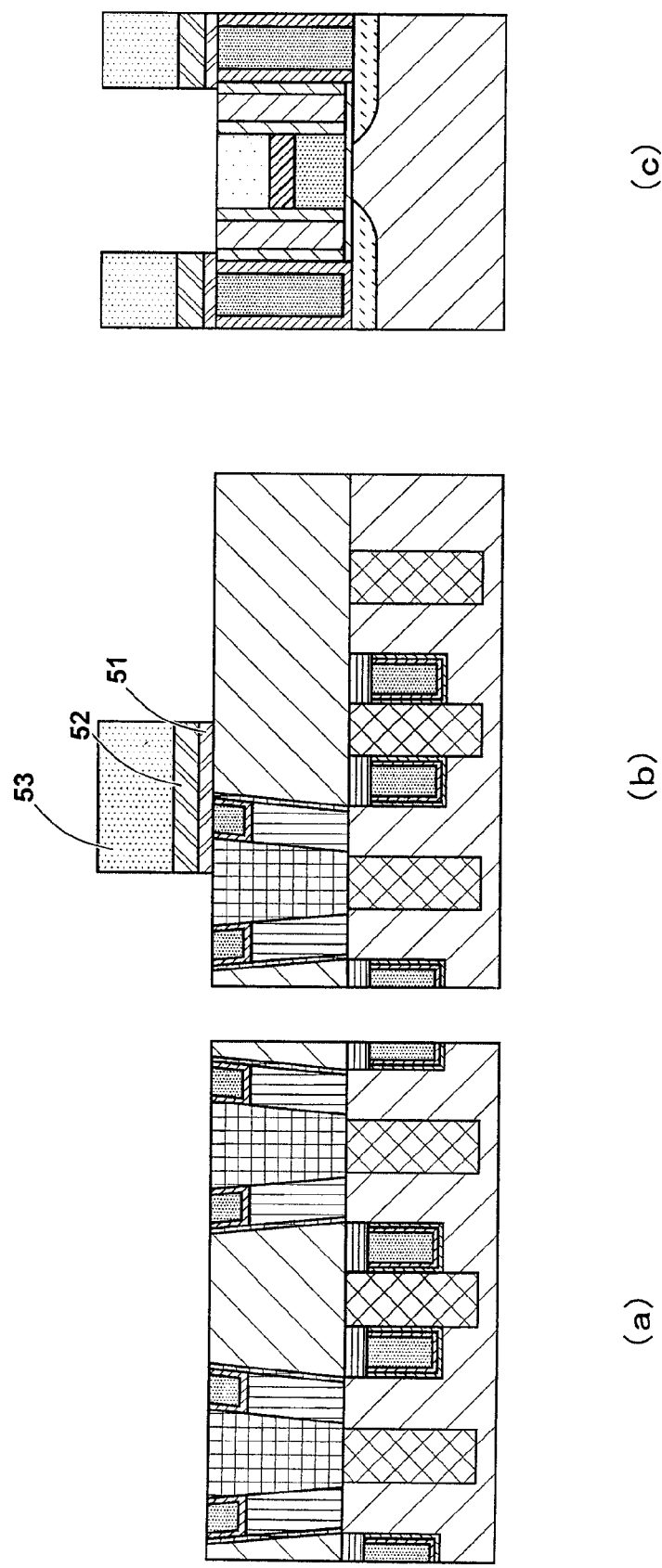
FIG. 13 is a view for explaining a third step of the formation method of forming the memory mat.

After the configuration shown in FIG. 11 is formed in the above-described manner, as shown in FIG. 12, 10-nm-thick tungsten nitride film (WN) 51 and 40-nm-thick tungsten film (W) 52 are formed on the configuration by sputtering.

After that, as shown in FIGS. 13A to 13C, photoresist (PR) 53 is applied to tungsten film 52. Photoresist 53 is patterned using exposure such that photoresist 53 remains above capacitor contacts 14 in the outermost peripheral portion of the cell region and above peripheral contacts 16 in the peripheral circuit region. Tungsten film 52 and tungsten nitride film 51 are etched by plasma dry etching using photoresist 53 as a mask. With this operation, the outermost peripheral capacitor contact pad covering dummy to capacitor contacts which are capacitor contacts in the outermost peripheral region is formed from tungsten film 52 and tungsten nitride film (WN) 51. In the peripheral circuit region, pieces of wiring which are connected to peripheral contacts 16 are formed. Note that, in this example, the outermost peripheral capacitor contact pad is formed to have a width that is wide enough to cover capacitor contacts in one row in each outermost peripheral portion so as to correspond to the first exemplary embodiment.

Figure 14:
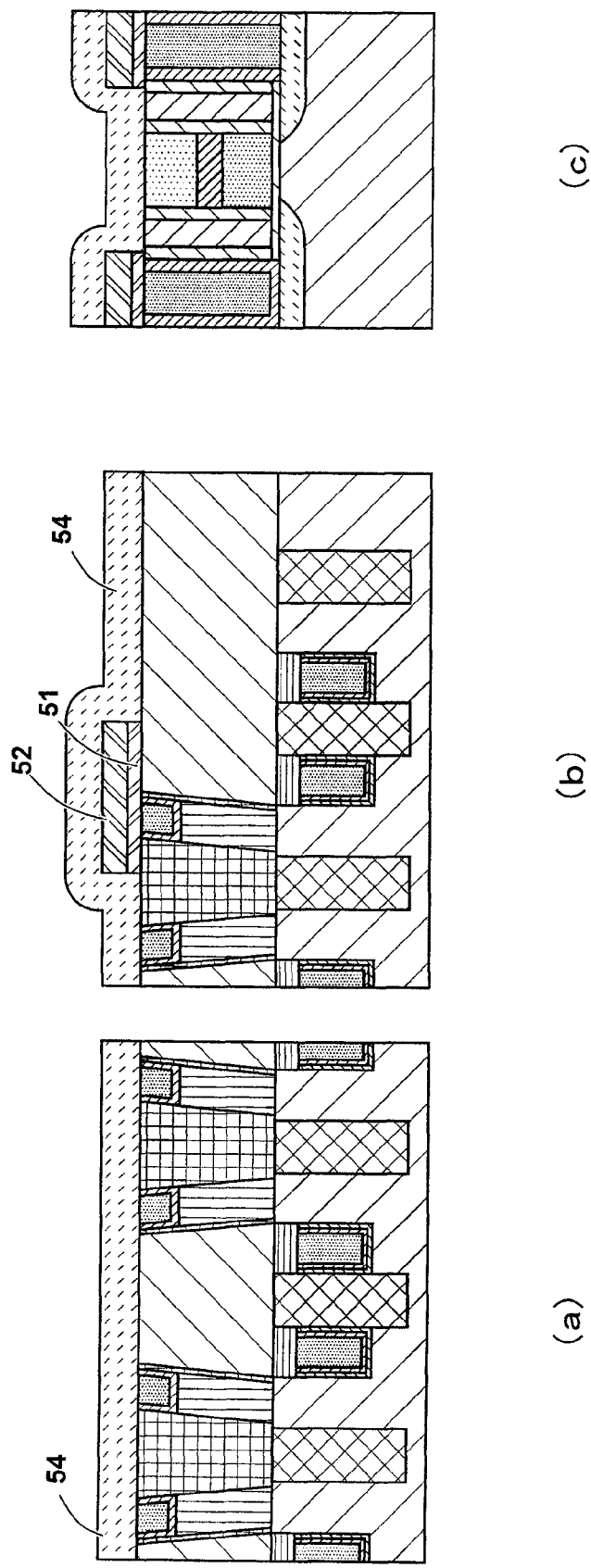
FIG. 14 is a view for explaining a fourth step of the formation method of forming the memory mat.

As shown in FIG. 14, photoresist 53 is removed, and 30-nm-thick silicon nitride film (SiN) 54 is then formed at a temperature of 500° C. to 600° C. by atomic layer deposition (ALD). With this operation, the surface of each outermost peripheral capacitor contact pad is completely covered with silicon nitride film 54.

As shown in FIG. 15, silicon oxide film ($SiO_2$) 55 is deposited to 1600 nm on silicon nitride film 54 by plasma-enhanced chemical vapor deposition (PECVD). Silicon nitride film (SiN) 56 is deposited to 80 nm on silicon oxide film 55 at a temperature of 500° C. to 600° C. by atomic layer deposition. Note that any other oxide film such as BPSG (Boron Phosphorus Silicon Glass) may be used instead of silicon oxide film 55. Alternatively, a plurality of types of oxide films may be stacked, depending on the application.

After that, as shown in FIG. 16, silicon nitride film 54, silicon oxide film 55, and silicon nitride film 56 are etched by plasma dry etching using as a mask amorphous carbon (not shown) patterned by lithography. Note that a material such as amorphous silicon, which can ensure an oxide film and a nitride film high etch selectivity, can be used as the mask instead of amorphous carbon. Note that multi-patterning that forms one pattern by performing lithography twice or more times may be used in the patterning of the mask.

Figure 17:
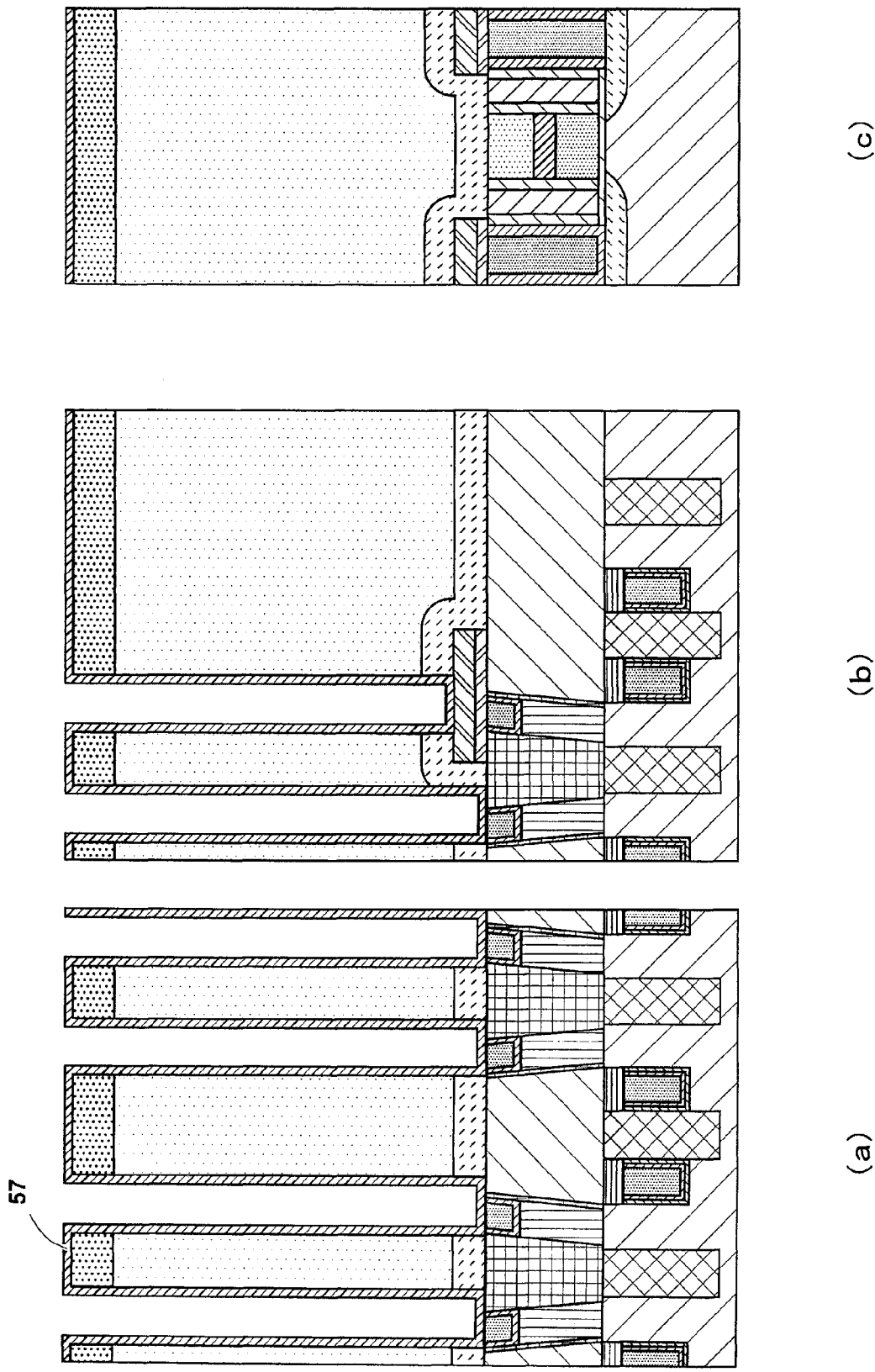
FIG. 17 is a view for explaining a seventh step of the formation method of forming the memory mat.

As shown in FIG. 17, titanium nitride film (TiN) 57 for a capacitor having a lower electrode is formed to 8 nm at a temperature of 400° C. by atomic layer deposition.

Figure 18:
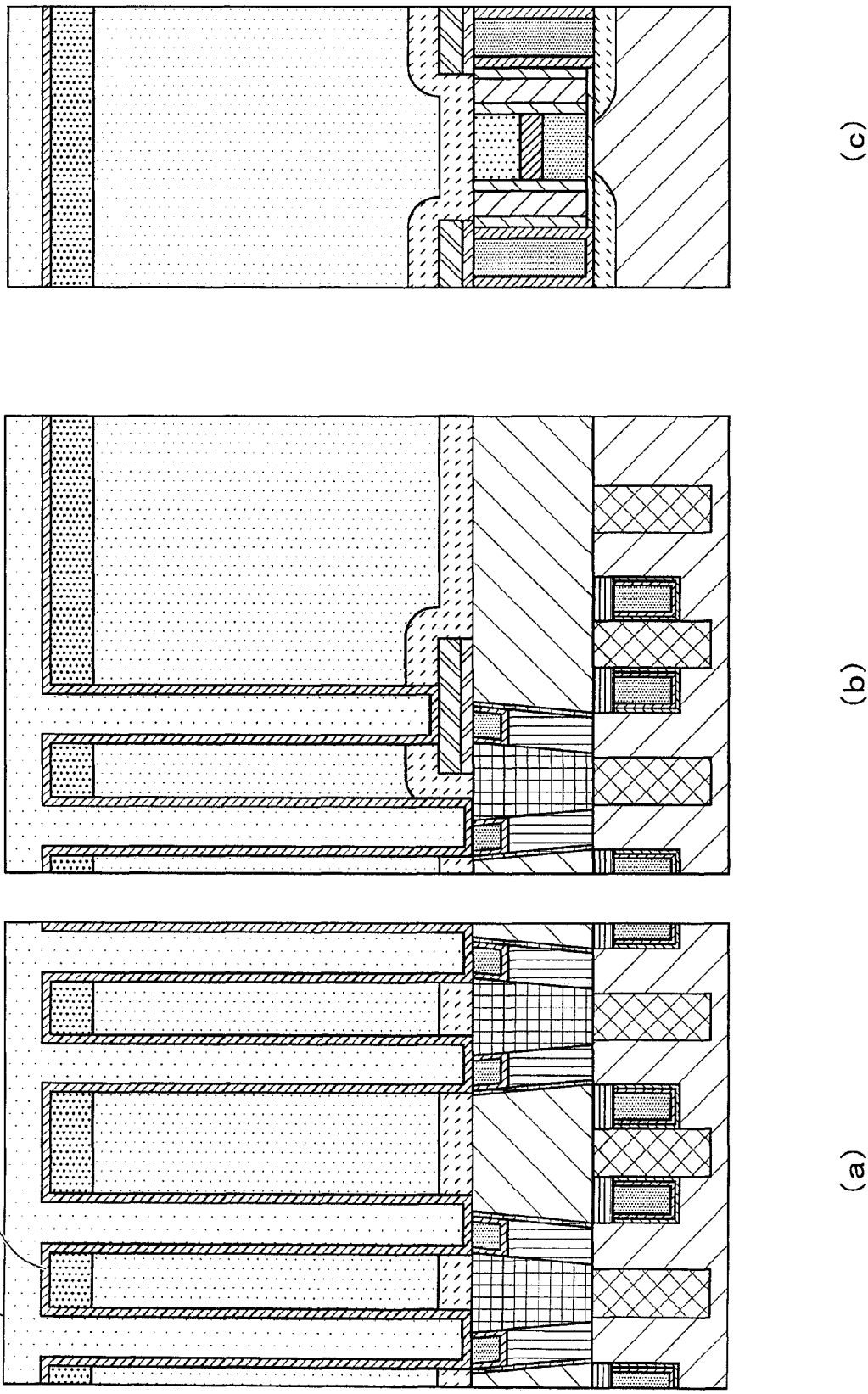
FIG. 18 is a view for explaining an eighth step of the formation method of forming the memory mat.

As shown in FIG. 18, 80-nm-thick silicon oxide film ($SiO_2$) 58 is formed on titanium nitride film 57 by low pressure chemical vapor deposition (LPCVD). With this operation, holes formed by the etching described with reference to FIG. 16 are completely filled.

Figure 19:
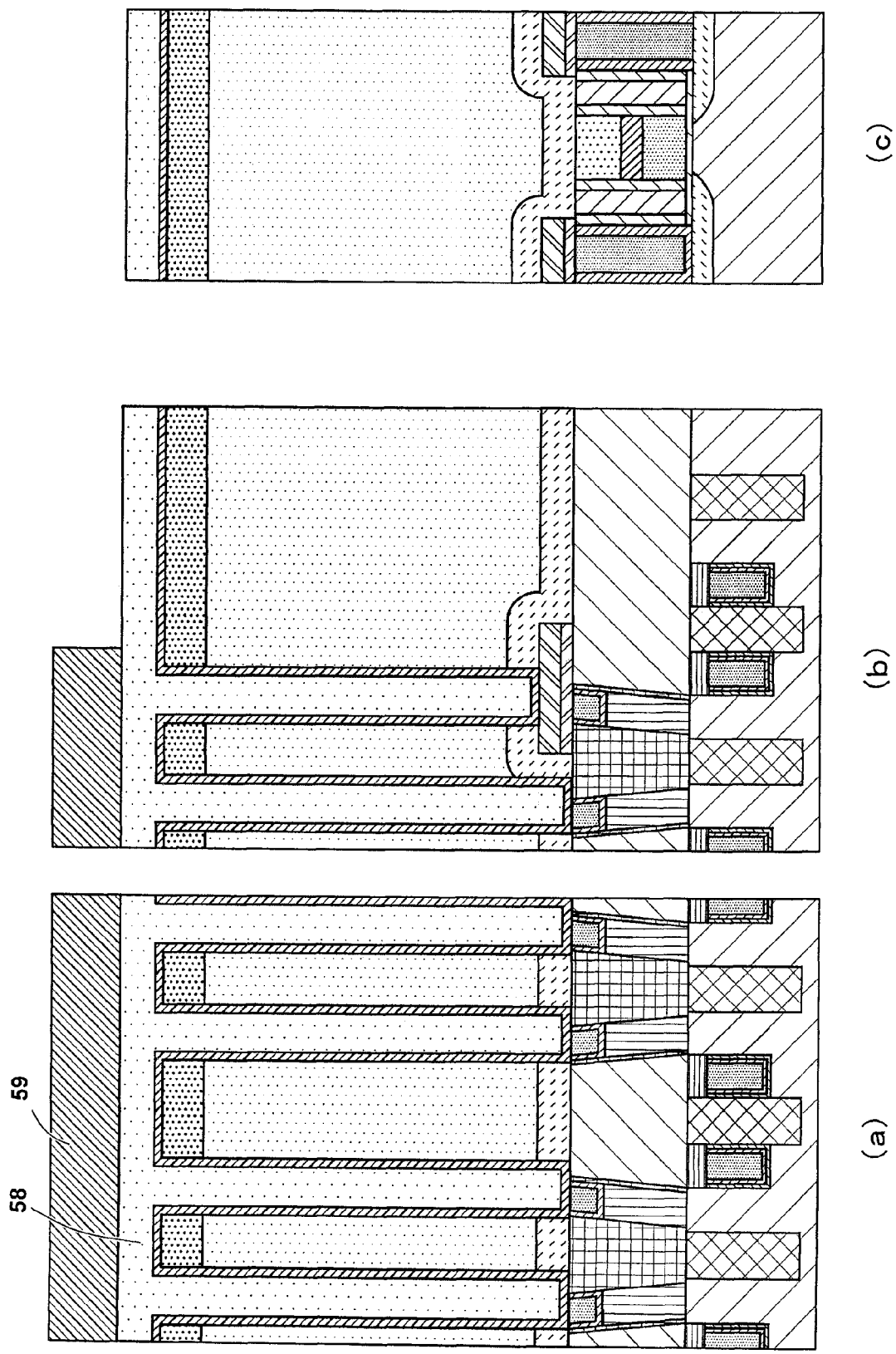
FIG. 19 is a view for explaining a ninth step of the formation method of forming the memory mat.

After that, as shown in FIG. 19, photoresist 59 is applied to silicon oxide film 58. Photoresist 59 is patterned by exposure such that photoresist 59 remains in the cell region.

Figure 20:
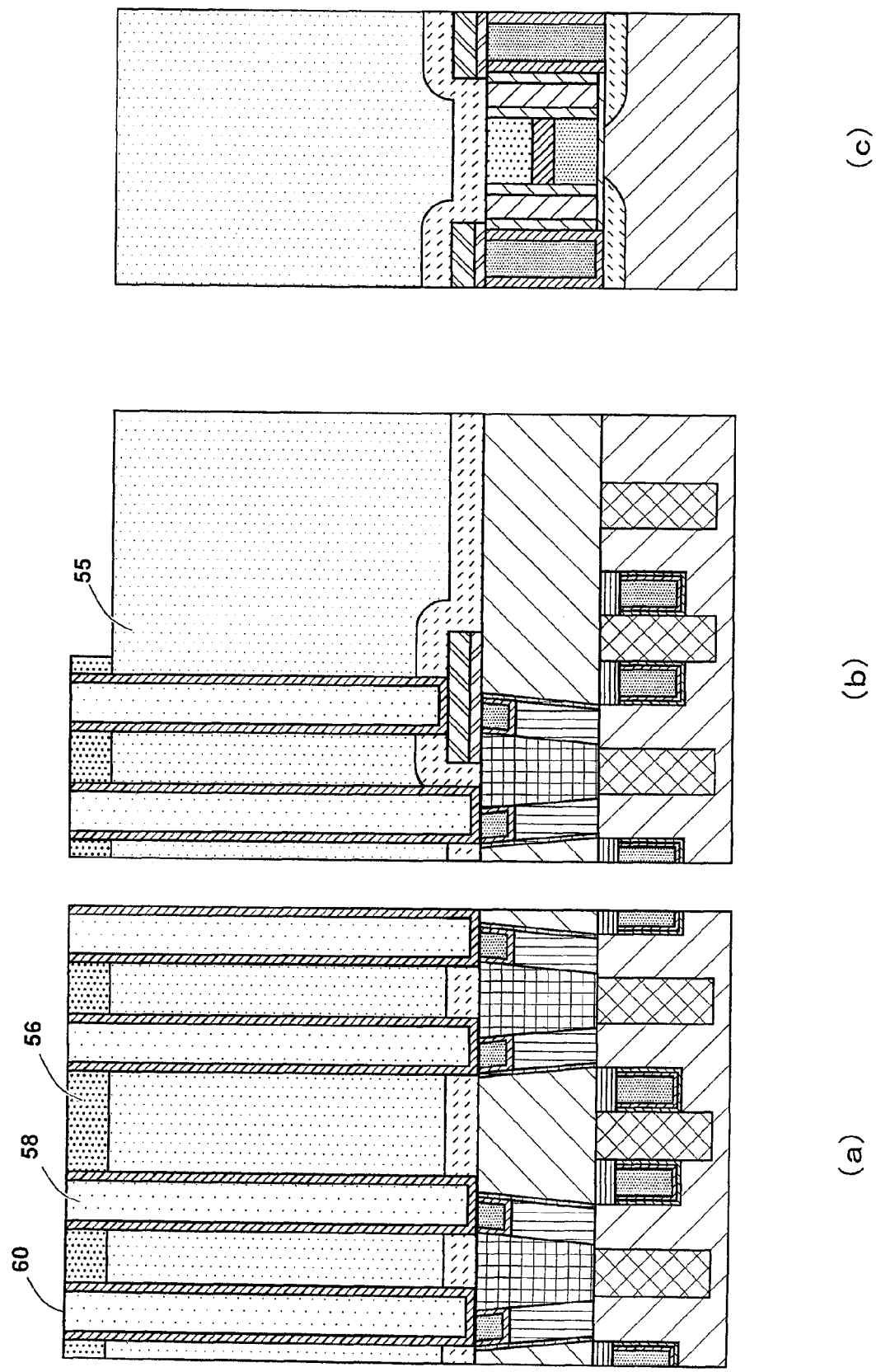
FIG. 20 is a view for explaining a tenth step of the formation method of forming the memory mat.

As shown in FIG. 20, silicon oxide film 58, titanium nitride film 57, and silicon nitride film 56 are etched in this order by using photoresist 59 as a mask. Photoresist 59 is removed, and silicon oxide film 58 and titanium nitride film 57 are etched in this order. Holes (not shown) for removing silicon oxide film 55 by wet etching are further formed in silicon nitride film 56.

Figure 21:
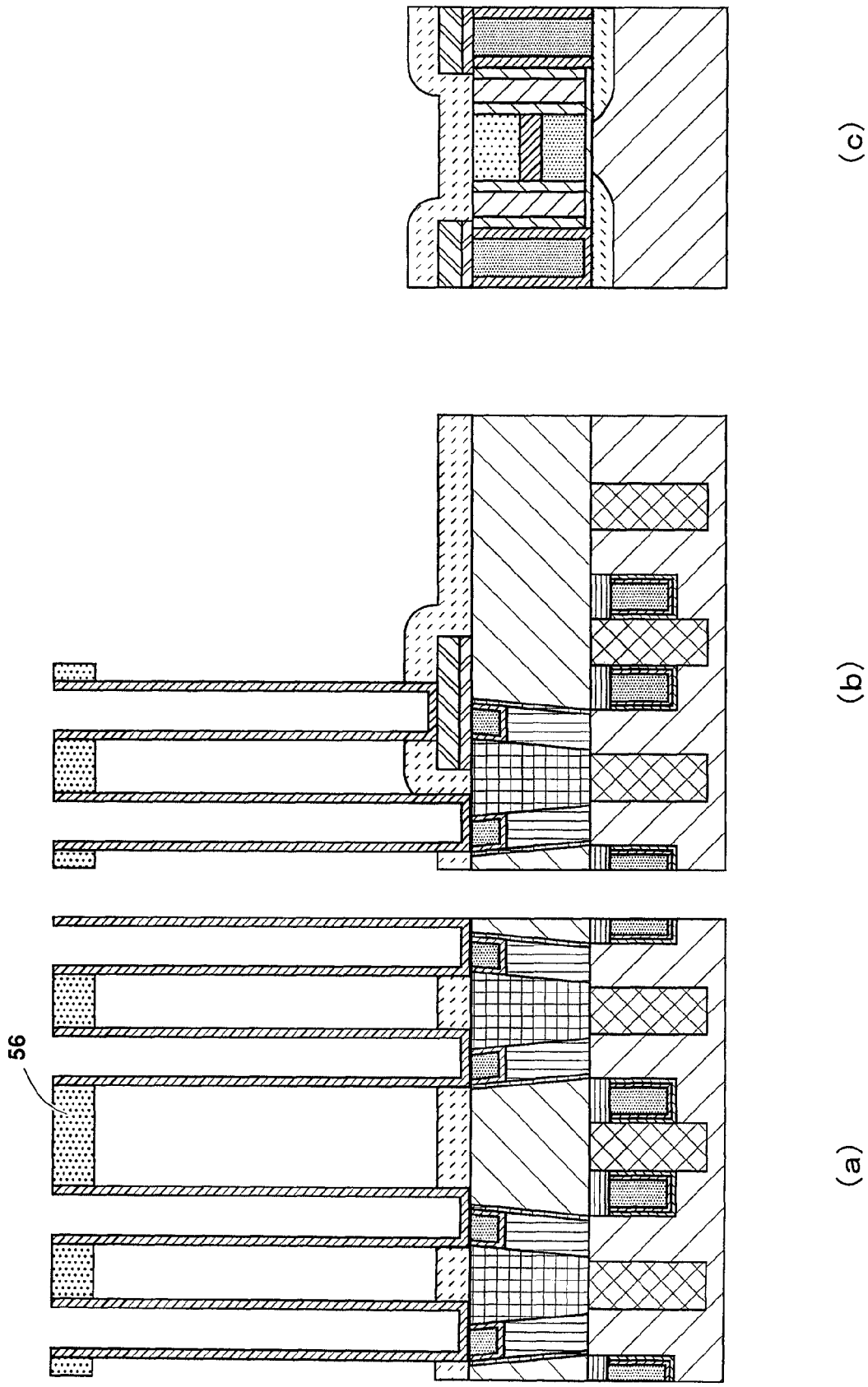
FIG. 21 is a view for explaining an 11th step of the formation method of forming the memory mat.

As shown in FIG. 21, silicon oxide films 55 and 58 are removed by wet etching (more specifically, wet etching using an etchant containing buffered HF). With this operation, the oxide films in the peripheral circuit region are all removed.

Figure 22:
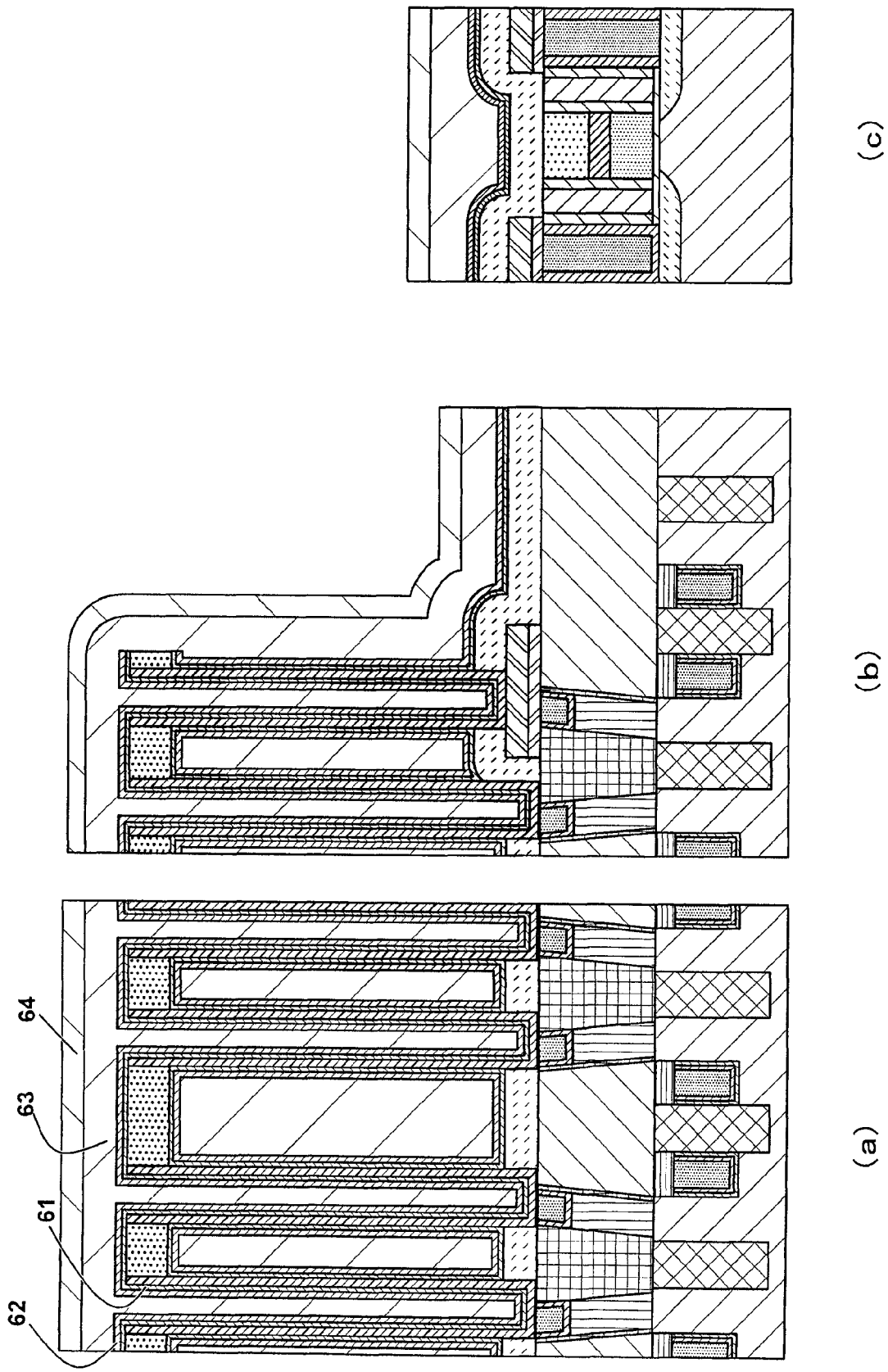
FIG. 22 is a view for explaining a 12th step of the formation method of forming the memory mat.

As shown in FIG. 22, capacitor film 61 containing zirconia ($ZrO_2$) is deposited to 5 nm by atomic layer deposition, and titanium nitride film (TiN) 62 for an upper electrode is deposited to 8 nm by atomic layer deposition. Silicon germanium film (SiGe) 63 is further formed on titanium nitride film 62 by low pressure chemical vapor deposition, and plate 64 made of tungsten (W) is deposited to 100 nm by sputtering.

Figure 23:
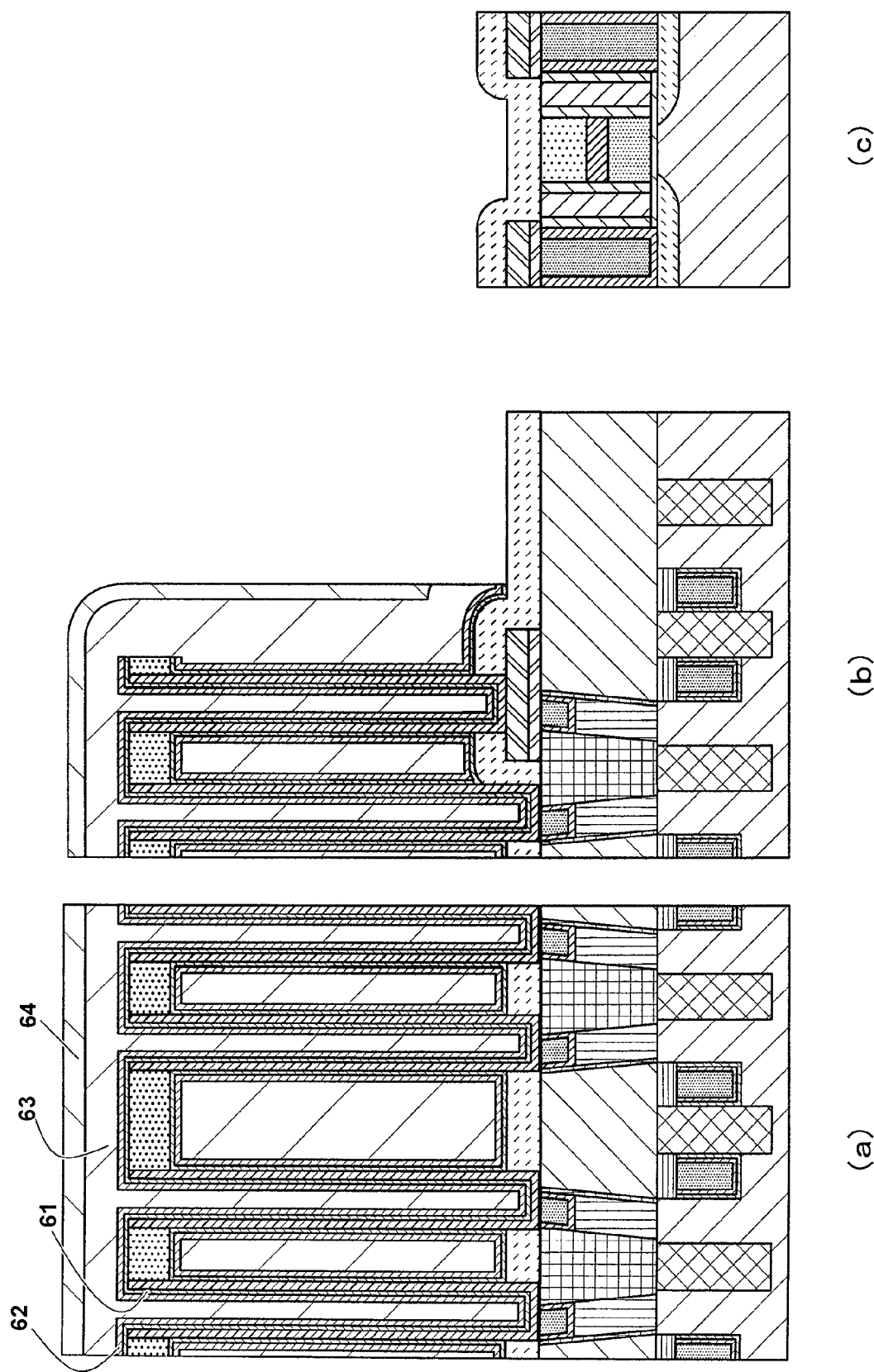
FIG. 23 is a view for explaining a 13th step of the formation method of forming the memory mat.

As shown in FIG. 23, exposure is performed by applying a photoresist (not shown). Unnecessary parts of capacitor film 61, titanium nitride film 62, silicon germanium film 63, and tungsten film 64 are removed by etching.

Next, a contact through which a piece of wiring is to be connected to plate 64 in the cell region and a contact which is to be connected to each piece of tungsten wiring in the peripheral circuit region are formed for DRAM formation. First to third wiring layers are formed above the contacts and are connected to the contacts. When the wiring layers are covered with an insulating film such as an oxide film or a polyimide film, a pre-process to be performed before DRAM formation is completed. Note that although wiring with aluminum, titanium nitride, and titanium layers is mainly used as a wiring layer to be connected to plate 64 in the cell region, wiring using copper (Cu) with resistance lower than those of aluminum, titanium nitride, and titanium may be used.

Figure 24:
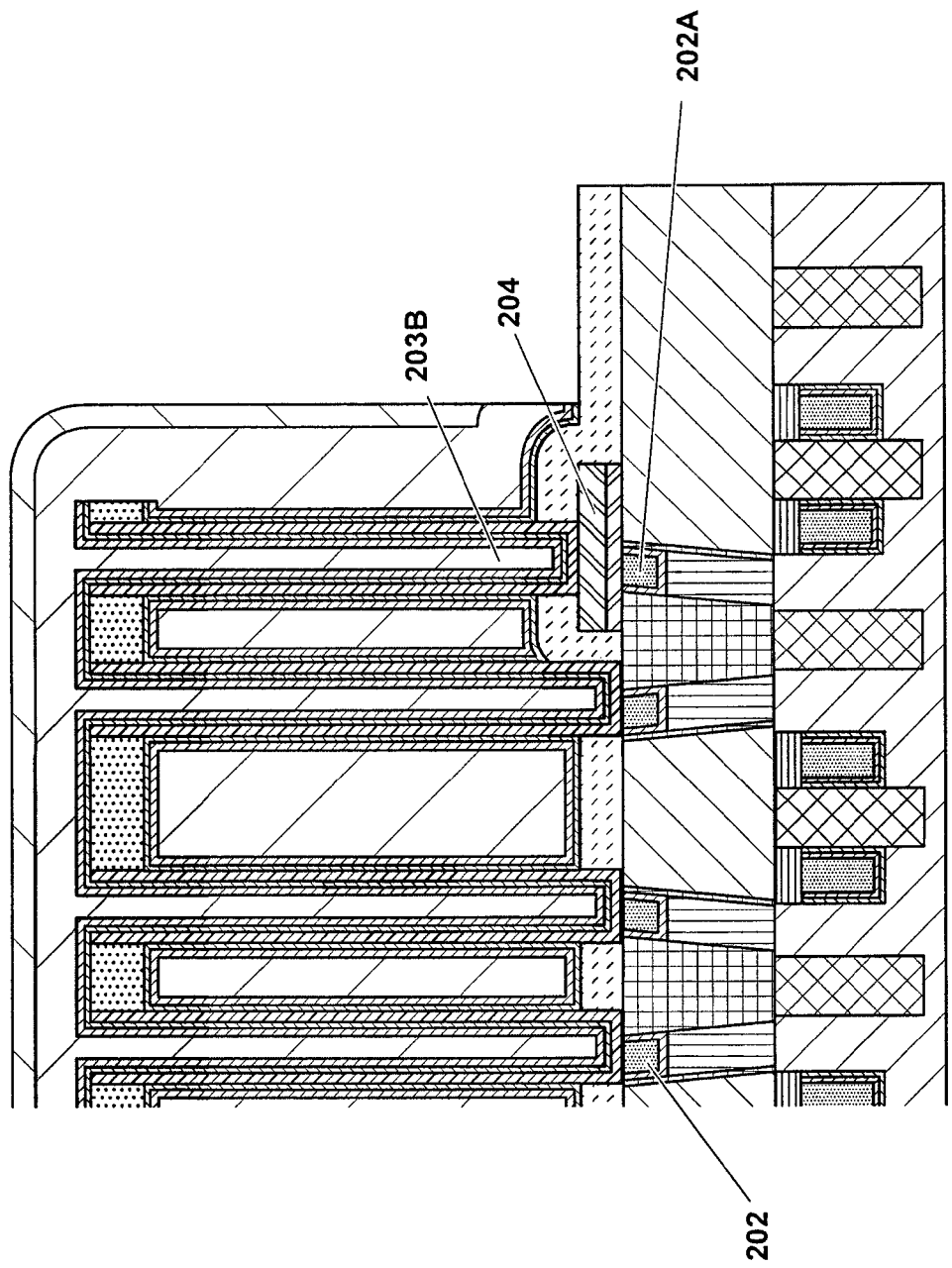
FIG. 24 is a vertical cross-sectional view schematically showing the memory mat configuration.

FIG. 24 is a view showing in more detail the outer peripheral portion shown in FIG. 5 and is, more specifically, a vertical cross-sectional view of a portion where capacitor contacts 202, in one row which are closest to a peripheral circuit region (more specifically, a region where sense amplifier 104 is formed) in a cell region of a memory device fabricated in the above-described manner, are formed as dummy capacitor contacts 202A. Note that the vertical cross-sectional view shown in FIG. 24 and that shown in FIG. 6 are not cross-sectional views in a same step.

Figure 25:
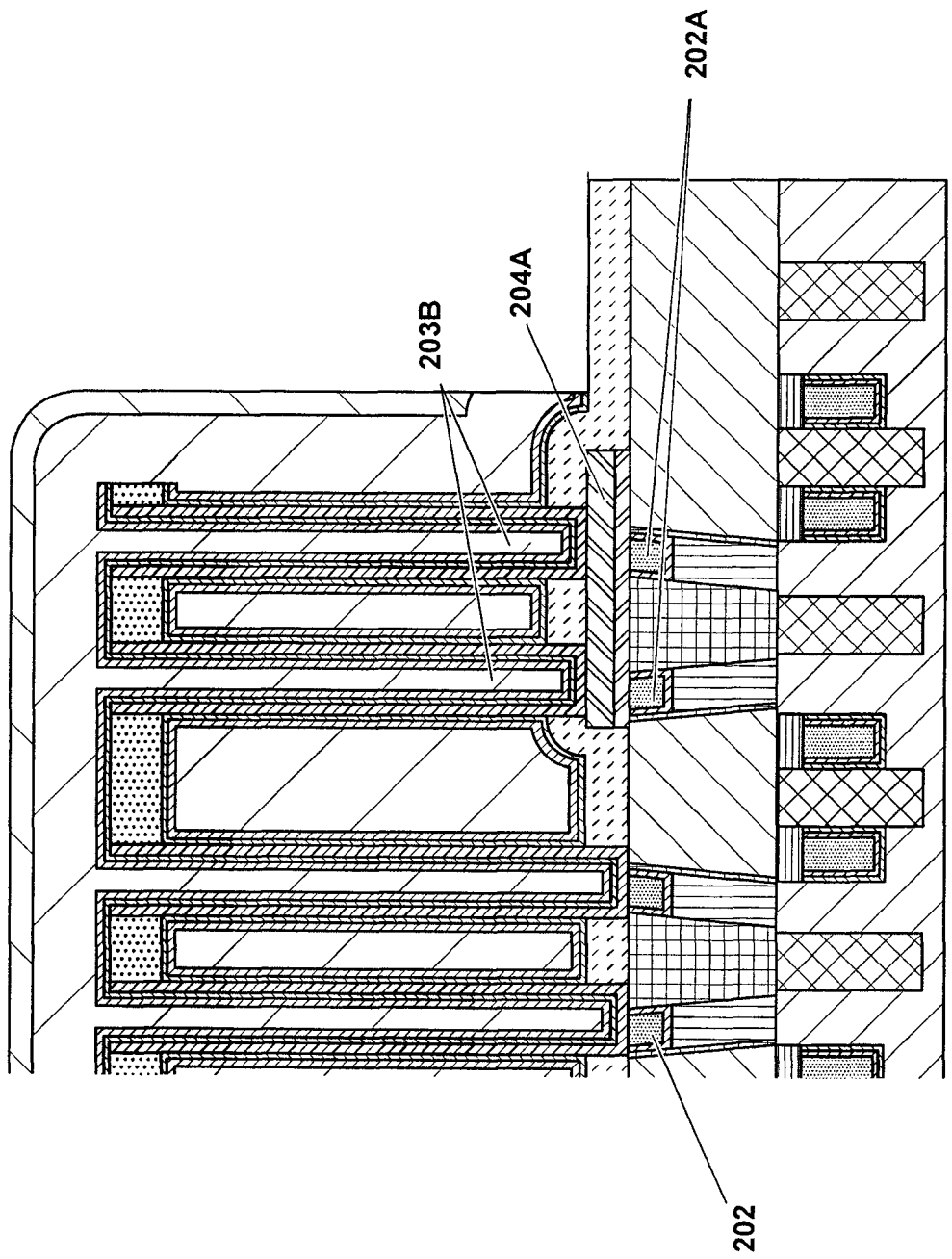
FIG. 25 is a vertical cross-sectional view schematically showing the different memory mat configuration.

FIG. 25 is a view showing in more detail an outer peripheral portion shown in FIG. 7 and is, more specifically, a vertical cross-sectional view of a portion where capacitor contacts 202, in two rows which are closest to a peripheral circuit region (more specifically, a region where sense amplifier 104 is formed) in a cell region of a memory device fabricated in the above-described manner, are formed as dummy capacitor contacts 202A. Note that the vertical cross-sectional view shown in FIG. 25 and that shown in FIG. 7 are not cross-sectional views in a same step.

Figure 26:
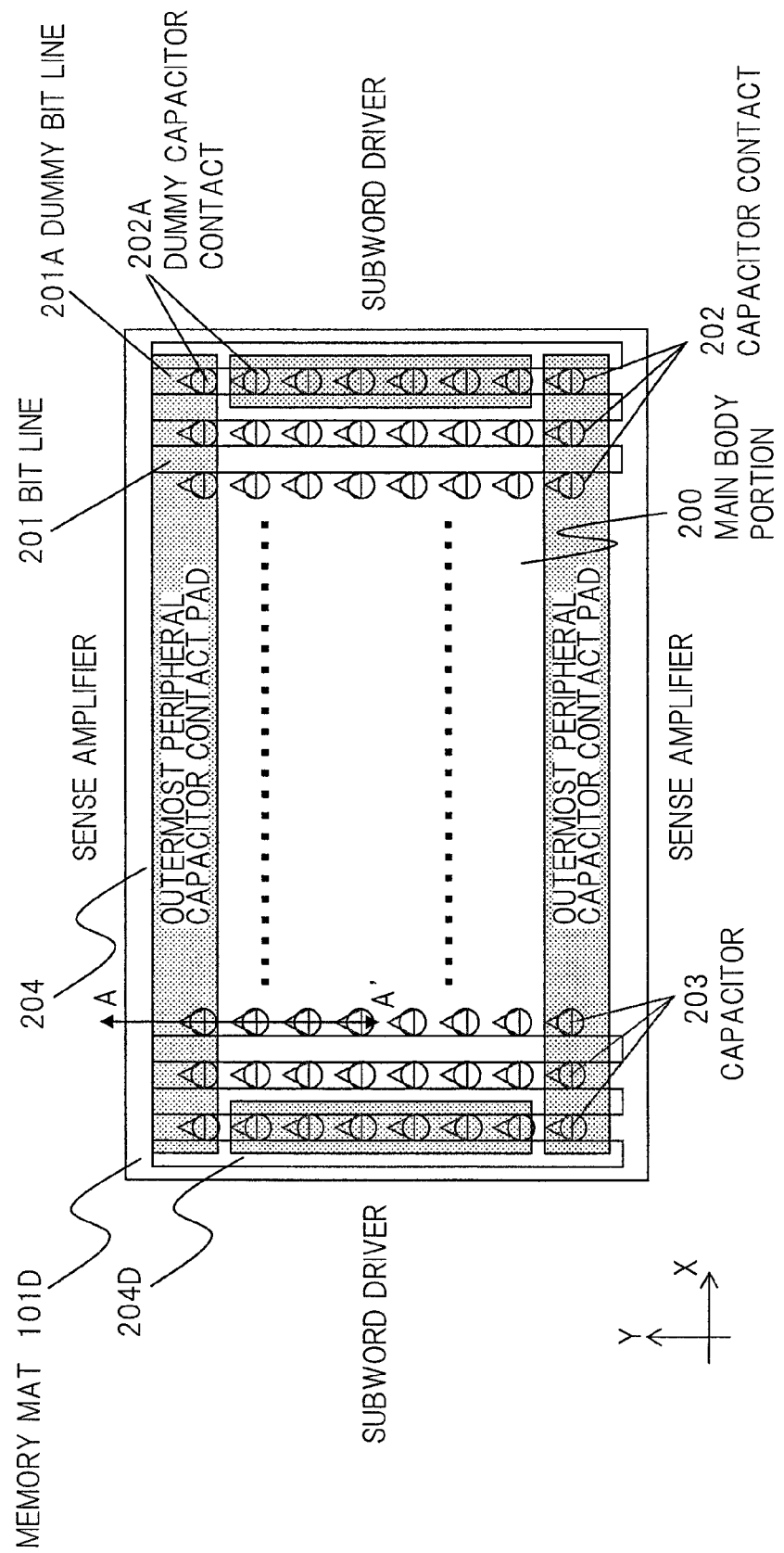
FIG. 26 is a top view schematically showing a different memory mat configuration.

FIG. 26 is a top view schematically showing the configuration of a memory mat included in a semiconductor device according to a sixth exemplary embodiment.

Memory mat 101D shown in FIG. 26 is different from memory mat 101 shown in FIG. 5 in that memory mat 101D further includes outermost peripheral capacitor contact pad 204D. Outermost peripheral capacitor contact pads 204D are formed along a Y direction between main body portion 200 and peripheral circuits 102 (more specifically, subword drivers 103). Outermost peripheral capacitor contact pads 204 and outermost peripheral capacitor contact pads 204D are separated from each other.

The present exemplary embodiment enables more reliably preventing a solution from penetrating into subword driver 103, like memory mat 101C described in the fourth exemplary embodiment (FIG. 9). Additionally, even if outermost peripheral capacitor contact pads 204 or 204D is exposed to an acid solution, the presence of portions, by which outermost peripheral capacitor contact pads 204 and 204D are separated from each other, allows enables preventing loss of all the outermost peripheral capacitor contact pads.

As described above, a semiconductor device according to the present exemplary embodiment includes a first conductive film (204) that is formed along a second direction orthogonal to a first direction between a main body portion (200) and a peripheral circuit (102) in the first direction and a second conductive film (204D) that is formed along the first direction between the main body portion (200) and a peripheral circuit (102) in the second direction. The first conductive film (204) and the second conductive film (204D) are separated from each other.

It is apparent that the present invention is not limited to the above embodiments, but may be modified and changed without departing from the scope and spirit of the invention.

What is claimed is:

1. A semiconductor device comprising:
   a memory mat and a peripheral circuit that is formed around said memory mat,
   wherein said memory mat includes:
   a main body portion that includes a first capacitor;
   a linear conductive film that is formed between the main body portion and said peripheral circuit, wherein the linear conductive film is linearly extended in a direction parallel to a boundary between the memory mat and the peripheral circuit; and
   a second capacitor that is formed to be in contact with the conductive film at a bottom of the second capacitor, and
   the first capacitor is formed to be in contact with a contact layer at a bottom of the first capacitor.

2. The semiconductor device according to claim 1, wherein the main body portion includes a bit line that extends along a first direction in a plane with said memory mat, and
   the conductive film is formed along a second direction orthogonal to the first direction between the main body portion and said peripheral circuit in the first direction.

3. A semiconductor device comprising:
   a memory mat and a peripheral circuit that is formed around said memory mat, wherein said memory mat includes:
   a main body portion that includes a first capacitor;
   a linear conductive film that is formed between the main body portion and said peripheral circuit; and
   a second capacitor that is formed to be in contact with the conductive film at a bottom of the second capacitor, and
   the first capacitor is formed to be in contact with a contact layer at a bottom of the first capacitor,
   the main body portion includes a bit line that extends along a first direction in a plane with said memory mat, and
   the conductive film is formed along a second direction orthogonal to the first direction between the main body portion and said peripheral circuit in the first direction; and
   a dummy bit line that extends along the first direction between the main body portion and said peripheral circuit in the second direction.

4. The semiconductor device according to claim 2, wherein at least one end of the conductive film is bent away from said peripheral circuit in the first direction.

5. The semiconductor device according to claim 1, wherein the conductive film is formed so as to surround the main body portion.

6. The semiconductor device according to claim 1, wherein the conductive film includes:
  a first conductive film that is formed along a second direction orthogonal to a first direction between the main body portion and said peripheral circuit in the first direction; and
  a second conductive film that is formed along the first direction between the main body portion and said peripheral circuit in the second direction, and
  the first conductive film and the second conductive film are separated from each other.

7. The semiconductor device according to claim 1, wherein a plurality of the second capacitors is formed to be arranged in a direction from said peripheral circuit toward the main body portion.

8. A semiconductor device comprising:
  a memory mat and a peripheral circuit that is formed around said memory mat,
  wherein said memory mat includes:
    a main body portion that includes a first capacitor;
    a linear conductive film that is formed between the main body portion and said peripheral circuit, wherein the linear conductive film is linearly extended in a direction parallel to a boundary between the memory mat and the peripheral circuit; and
    a second capacitor,
  wherein the first capacitor is formed to be in contact with a contact layer at a bottom of the first capacitor, and
  wherein the linear conductive film is in contact with a bottom surface of an electrode of the second capacitor.

* * * * *